(12) United States Patent
Tsuzuki

(10) Patent No.: US 7,360,660 B2
(45) Date of Patent: Apr. 22, 2008

(54) ACCOMMODATION APPARATUS OF ELECTRONIC UNIT

(75) Inventor: Hiroyuki Tsuzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 132 days.

(21) Appl. No.: 11/080,559

(22) Filed: Mar. 16, 2005

(65) Prior Publication Data

US 2005/0211869 A1 Sep. 29, 2005

(30) Foreign Application Priority Data

Mar. 24, 2004 (JP) ............... 2004/087838

(51) Int. Cl.
*A47G 19/08* (2006.01)
(52) U.S. Cl. ............. 211/41.17; 248/694; 361/797
(58) Field of Classification Search ........... 248/694, 248/183.4, 185.1; 211/41.17; 361/801, 361/802, 796, 797, 798, 756, 724
See application file for complete search history.

(56) References Cited

U.S. PATENT DOCUMENTS

| | | | | |
|---|---|---|---|---|
| 5,140,501 A | * | 8/1992 | Takahashi et al. | 361/798 |
| 6,128,196 A | * | 10/2000 | Hoyle et al. | 361/752 |
| 6,937,467 B2 | * | 8/2005 | Hsu | 361/686 |
| 2003/0116515 A1 | * | 6/2003 | Ureshino | 211/41.17 |
| 2004/0173726 A1 | * | 9/2004 | Mercadal et al. | 248/660 |

FOREIGN PATENT DOCUMENTS

| JP | 64-6084 U | 1/1989 |
|---|---|---|
| JP | 1-93778 U | 6/1989 |
| JP | 2000-353833 A | 12/2000 |

* cited by examiner

*Primary Examiner*—Ramon O Ramirez
(74) *Attorney, Agent, or Firm*—Sughrue Mion, PLLC

(57) ABSTRACT

An accommodation apparatus accommodates a unit which needs maintenance from at least three planes. The accommodation apparatus includes a chassis, a first frame structure configured to accommodate the unit, and a supporting mechanism coupled to the first frame structure and the chassis to support the first frame structure to the chassis such that at least one of attitude and position of the unit is changeable with respect to the chassis.

16 Claims, 26 Drawing Sheets

Fig. 17A
Fig. 17B
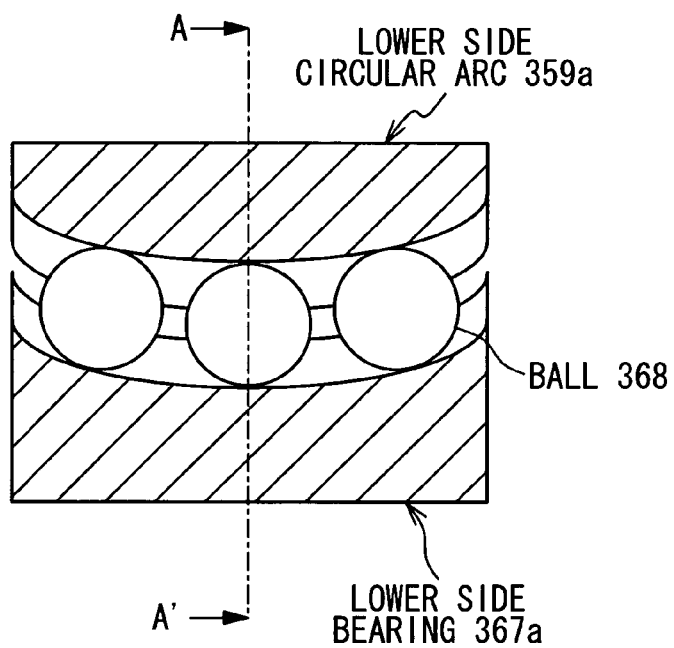
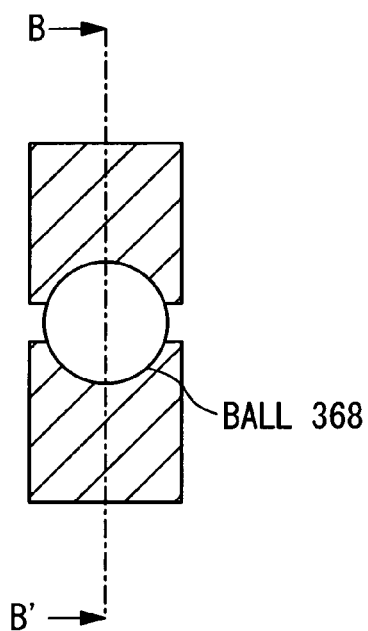

ACCOMMODATION APPARATUS OF ELECTRONIC UNIT

BACKGROUND OF THE INVENTION

1. Field of the Invention

The present invention relates to an accommodation apparatus to accommodate an electronic unit.

2. Description of the Related Art

Conventionally, an electronic apparatus to be installed in an information processing apparatus, that is, an electronic unit is mainly a one-plane mount structure or a two-plane mount structure. As shown in FIGS. 1 and 2, in the one-plane or two-plane mount structure, printed circuit boards 12 are arranged on one plane or two planes of a backboard 10 through connectors 11. The printed circuit boards 12 are vertically arranged on the surface of the backboard 10. Such an information processing apparatus that the printed circuit boards 12 are installed on both sides necessitates maintenance from the front and back planes of the apparatus.

However, in recent years, for a high density mounting, it is requested to install the printed circuit boards, as shown in FIG. 5. An electronic unit 54 shown in FIG. 5 needs maintenance from four planes of front, back, upward, and downward planes. The structure of the electronic unit 54 is assembled as follows. First, LSIs 2 are installed on one plane of each of motherboards 1 (1a and 1b) as shown in FIG. 3. Next, as shown in FIG. 4, a plurality of the printed circuit boards 4 are installed through connectors 3 (3a and 3b) on the other plane of the motherboard 1, that is, a back plane on which the LSIs 2 are installed. The printed circuit boards 4 are arranged in the vertical direction to the motherboard 1 through the connectors 3. Referring to FIG. 5, another motherboard 1 on which LSIs 2 are arranged on one plane is arranged in parallel to the motherboard 1.

Here, the electronic unit shown in FIG. 5 will be described in detail. In FIG. 5, the motherboards 1a and 1b are circuit boards on which the connectors 3a and 3b are installed. The printed circuit board 4 is a circuit board on which electronic parts such as LSIs 2 are mounted. An air-cooling system is necessary to cool the parts since the electronic parts such as the LSIs 2 generate heat. The motherboards 1a and 1b includes the connectors 3a and 3b, and wiring patterns (not shown). The connectors 3a are arranged adjacent to the connectors 3b on the motherboards 1a and 1b. Specifically, a row of the connectors 3b is arranged adjacent to the row of the connectors 3a on a lower side of it. Regions for the connectors 3a and 3b may overlap. In such a case, the connectors 3a and 3b are alternately arranged. The connector 3a and the connector 3b are arranged in approximately parallel to each other. However, the direction to insert the printed circuit board 4 into the connector 3a is opposite to the direction to insert the printed circuit board 4 into the connector 3b. Therefore, a different kind of printed circuit boards 4 are possibly inserted from both ends of the motherboards 1a and 1b. The printed circuit boards 4 inserted in the connectors 3b and the printed circuit boards 4 inserted in the connectors 3a can be electrically connected to each other through the motherboards 1a or 1b. The structure shown in FIG. 5 may be modified such that the connectors 3a are arranged in a region adjacent to the longer side of the connectors 3b.

Next, the connector 3 will be simply described bellow. FIG. 6 is a perspective view of the connector 3. The connector 3 is supported on the motherboard 4 as a support member. The connector 3 is a female connector 62. The female connector 62 has an opening 67 in one shorter side to receive the edge 69 of the printed circuit board 4. Guides 68 extend along the longer side of the female connector 62 from the opening 67. The printed circuit board 4 is slid in the longitudinal direction of the female connector 62 along the guides 68. The guides 68 guide the printed circuit board 4 to an engagement position. The connector 3 shown in FIG. 6 has a fixing part to fix the edge 69 of the printed circuit board 4 to the female connector 62 at the engagement position of the connector 3. The fixing part includes a terminal opening and shutting part 64 and terminals 63. The terminals 63 can fix or release the edge 69 of the printed circuit board 4 according to the operation of the terminal opening and shutting part 64.

The opening and shutting part 64 is operated when the edge 69 of the printed circuit board 4 is inserted into the female connector 62, or the edge 69 of the printed circuit board 4 is released or pulled out from the female connector 62. The terminals 63 are opened in the direction perpendicular to the longitudinal direction of the female connector 62 through the operation of the opening and shutting part 64.

On the other hand, when the edge 69 of the printed circuit board 4 is fixed to the female connector 62, the opening and shutting mechanism 64 is operated again. The terminals 63 are closed into the direction perpendicular to the female connector 62 through the operation of the opening and shutting part 64. The printed circuit board 4 has terminals 65 to be connected with the female connector 62 along the edge 69 of the printed circuit board 4. The edge 69 of the printed circuit board 4 is inserted from the opening 67 of the female connector 62 when the terminals 63 of the female connector 62 are opened. The edge 69 of the printed circuit board 4 is slid into the female connector 62 in the longitudinal direction of the female connector 62. When the printed circuit board 4 is inserted to the engagement position, the terminals 65 of the printed circuit board 4 and the corresponding terminals 63 of the connector 62 face to each other at the engagement position. After the printed circuit board 4 has been inserted to the engagement position, the opening and shutting part 64 is operated. The terminals 63 are closed through the operation of the opening and shutting part 64. The edge 69 of the printed circuit board 4 is fixed to the female connector 62 according to the closed state of the terminals 63. Thus, the terminals 63 and the terminals 65 are respectively connected electrically.

The printed circuit board 4 has terminals 65 at both ends when each of the motherboards 1 has the connectors, as shown in FIG. 5.

When the electronic unit shown in FIG. 5 is installed in the conventional accommodation apparatus, maintenance from four planes are needed of planes on which the LSIs 2 are installed, and planes for inserting and pulling out the printed circuit boards 4. In this case, a maintenance space cannot be secured when a plurality of accommodation apparatuses are provided adjacent to each other. Therefore, the plurality of accommodation apparatuses are arranged not to be adjacent. Thus, it is hard to provide many accommodation apparatuses in a limited space.

In conjunction with the above description, Japanese Laid Open Patent Application (JP-P2000-353883A) discloses an electronic apparatus and a maintenance method in order to solve the problem of securing the maintenance space. This conventional example aims improvement of accommodation efficiency of the electronic apparatus and simplification of the maintenance. A unit is rotated in the front direction.

Also, Japanese Laid Open Utility Model Application (JP-U-Showa 64-6084) discloses a rotation setting mechanism of an electronic unit chassis. This application aims to facilitate check and maintenance of the electronic unit in a narrow space such as inside of a ship. The electronic unit chassis includes slide rails and a rotation shaft. The electronic unit chassis is maintained from a single plane of the chassis from which circuit boards are installed. The electronic unit chassis is pulled out in the front direction of a cabinet by using slide rails provided on the both sides of the electronic unit chassis. In addition, the electronic unit chassis is inclined to the front direction. The inclination of the electronic unit chassis is set to an optional angle within the range of 90°. As a result, the check and maintenance can be carried out by connecting a test board with the circuit board from the front direction.

Also, Japanese Laid Open Utility Model Application (JP-U-A-Heisei 1-93778) discloses an accommodation pulling-out mechanism. This conventional example aims to improve maintenance efficiency of an apparatus. Guide foots are provided for each of electronic units accommodated in a chassis to support rotation of the unit in a vertical direction. Also, guide grooves are provided on a base as a bottom section of the chassis. By providing the guide foots on the guide grooves, the electronic unit can be moved along the guide grooves in the chassis, and can be rotated around the vertical axis. As a result, it is no need to pull out the electronic unit to outside of the chassis every time the maintenance is carried out.

SUMMARY OF THE INVENTION

An object of the present invention is to provide an accommodation apparatus which allows maintenance of an electronic unit being maintained from at least three planes to be carried out in a small space.

In an aspect of the present invention, an accommodation apparatus accommodates a unit which needs maintenance from at least three planes. The accommodation apparatus includes a chassis, a first frame structure configured to accommodate the unit, and a supporting mechanism coupled to the first frame structure and the chassis to support the first frame structure to the chassis such that at least one of attitude and position of the unit is changeable with respect to the chassis.

Here, it is preferable that the supporting mechanism rotatably supports the first frame structure.

Also, the supporting mechanism may include a rotation axis coupled to the first frame structure, and bearings coupled to the chassis to receive the rotation axis. The rotation axis passes through a center of gravity of the unit.

Also, the supporting mechanism may include a first pulley coupled to the first frame structure and provided on a rotation axis passing through a center of gravity of the unit, second pulleys coupled to the chassis, and a torque transfer member hung to the first and second pulleys. The first pulley is communicated with the second pulleys by the torque transfer member.

Also, the supporting mechanism may include a first gearwheel coupled to the first frame structure and provided on a rotation axis passing through a center of gravity of the unit, second gearwheels coupled to the chassis, and a chain hung to the first and second pulleys. The first pulley is communicated with the second gearwheels by the chain.

Also, the supporting mechanism may include first and second circular arcs coupled to the first frame structure, wherein a center position of the first and second circular arcs passes through a center of gravity of the unit, and bearings coupled to the chassis. The first frame structure is rotated when the first and second circular arcs are moved through the bearings.

Also, the chassis may further include a second frame structure configured to accommodate the first frame structure, and slide rails configured to allow the second frame structure to slide on the slide rails such that the unit is pulled out.

Also, when the chassis further includes a second frame structure configured to accommodate the first frame structure, and slide rails configured to allow the second frame structure to slide on the slide rails such that the unit is pulled out, the bearings may be provided for the second frame structure.

Also, when the chassis further includes a second frame structure configured to accommodate the first frame structure, and slide rails configured to allow the second frame structure to slide on the slide rails such that the unit is pulled out, the second pulleys may be provided for the second frame structure.

Also, when the chassis further includes a second frame structure configured to accommodate the first frame structure, and slide rails configured to allow the second frame structure to slide on the slide rails such that the unit is pulled out, the second gearwheels may be provided for the second frame structure.

Also, when the chassis further includes a second frame structure configured to accommodate the first frame structure, and slide rails configured to allow the second frame structure to slide on the slide rails such that the unit is pulled out, the bearings may be provided for the second frame structure.

Also, the torque transfer member may be a belt or a wire.

Also, each of the bearings may include a bearing body provided for the chassis to have a surface corresponding to a corresponding one of the first and second circular arcs, and balls provided between the corresponding one of the first and second circular arcs and the bearing body. Each of the first and second circular arcs and the bearings may have a groove with a semicircular cross section. Instead, each of the first and second circular arcs and the bearings may have a groove with a cuneal cross section.

Also, each of the bearings may include a bearing body provided for the chassis to have a surface corresponding to a corresponding one of the first and second circular arcs, and rollers provided between the corresponding one of the first and second circular arcs and the bearing body.

Also, each of the bearings may include a bearing body provided for the chassis to have a surface corresponding to a corresponding one of the first and second circular arcs, and a spacer provided between the corresponding one of the first and second circular arcs and the bearing body.

Also, a rotation direction of the first frame structure is preferably orthogonal to a direction of the slide rails.

BRIEF DESCRIPTION OF THE DRAWINGS

FIGS. 17A and 17B are cross sectional views of an example of the support mechanism;

DESCRIPTION OF THE PREFERRED EMBODIMENTS

Hereinafter, an accommodation apparatus of an electronic unit of the present invention will be described in detail with reference to the attached drawings.

First Embodiment

Figure 1:
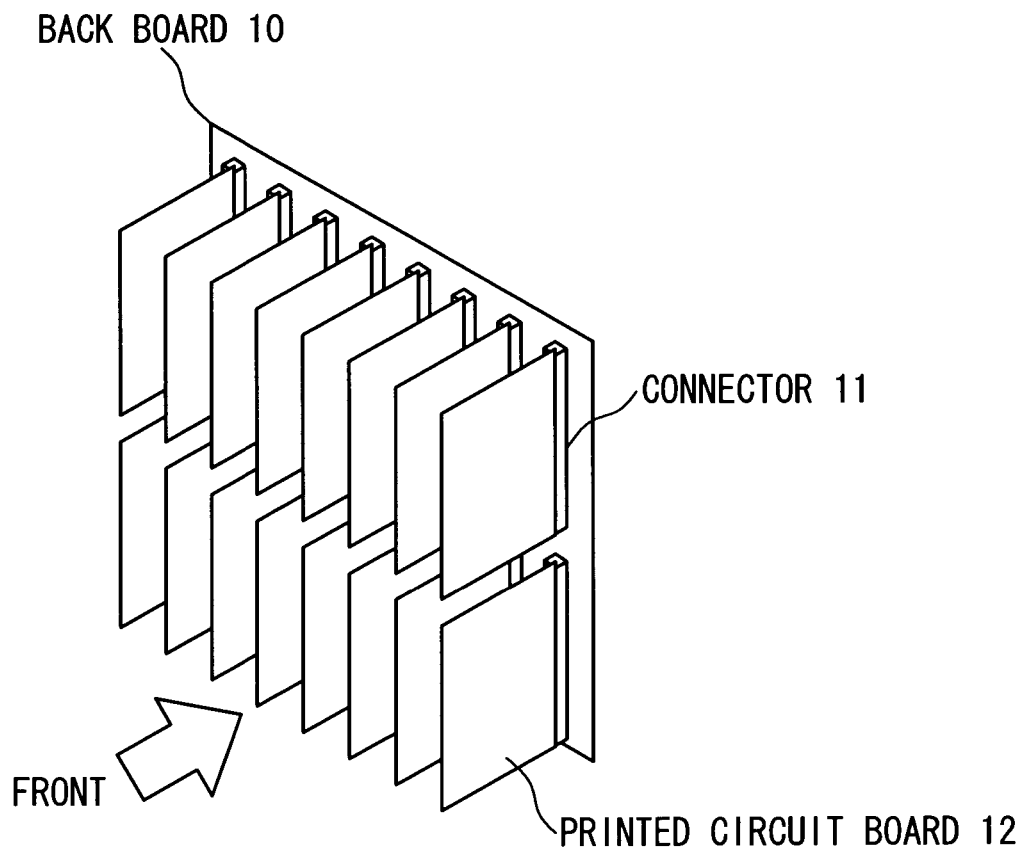
FIG. 1 is a diagram showing a conventional one-plane mount structure.
Figure 2:
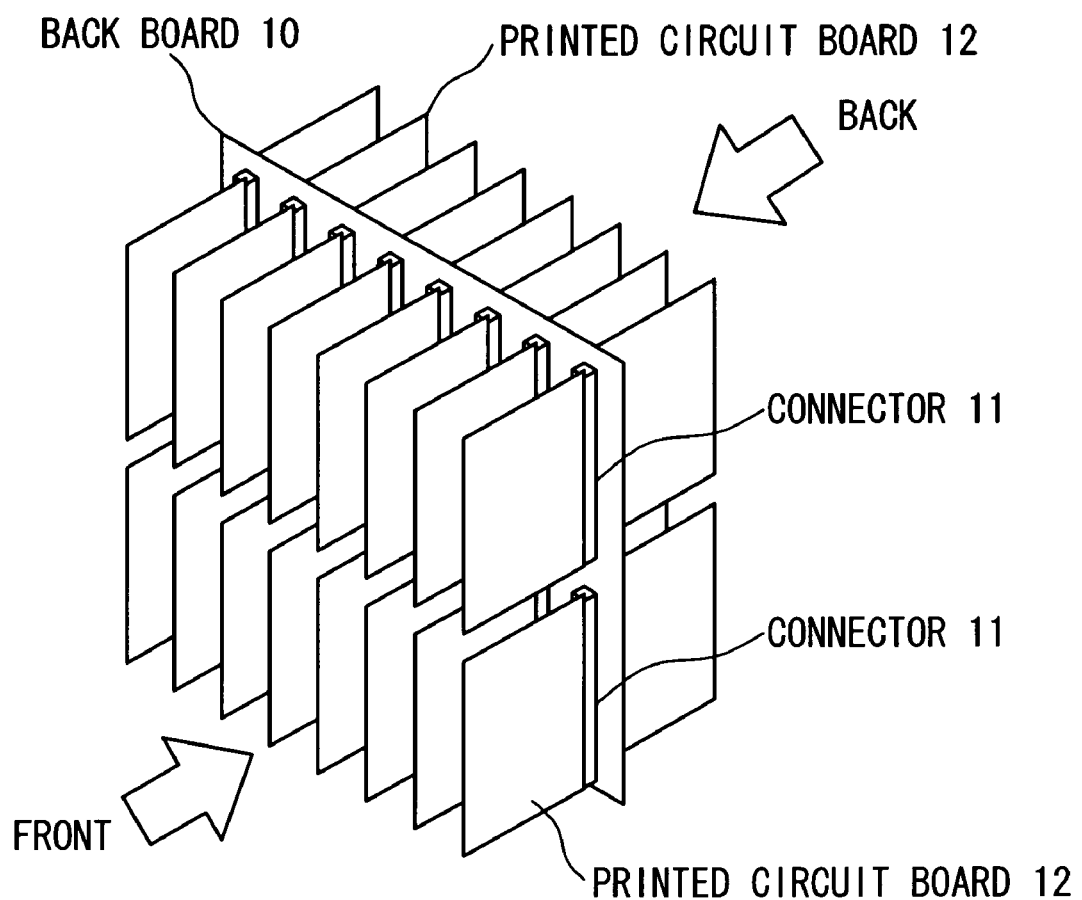
FIG. 2 is a diagram showing a conventional two-plane mount structure.
Figure 3:
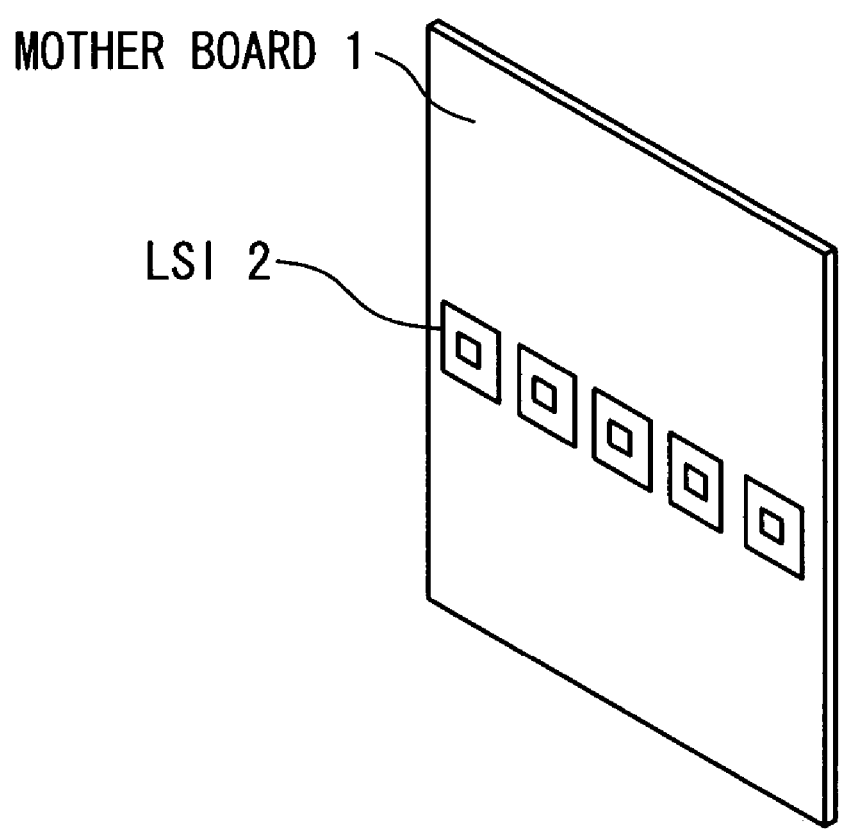
FIG. 3 is a diagram showing a conventional motherboard on which LSIs 2 are mounted.
Figure 4:
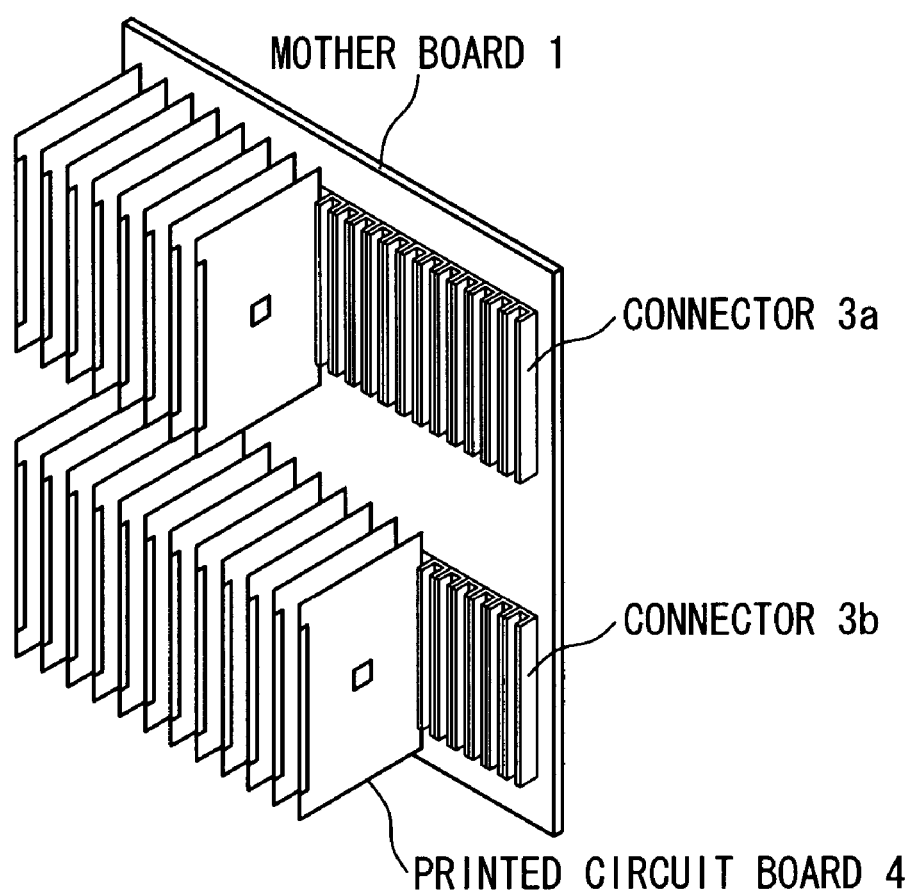
FIG. 4 is a diagram showing a state that printed circuit boards are installed on the motherboard.
Figure 5:
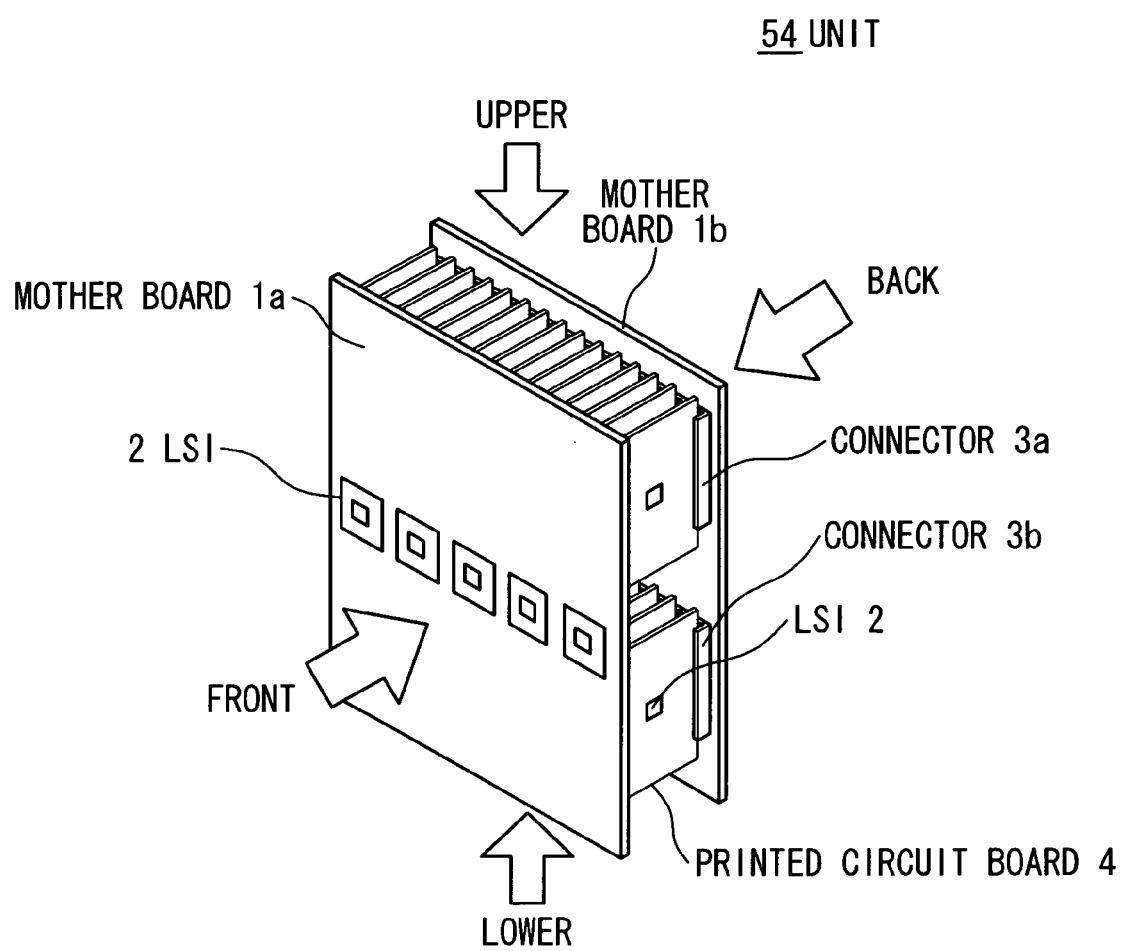
FIG. 5 is a diagram showing a conventional electronic unit which needs maintenance from four planes of front, back, upward, and downward planes.
Figure 6:
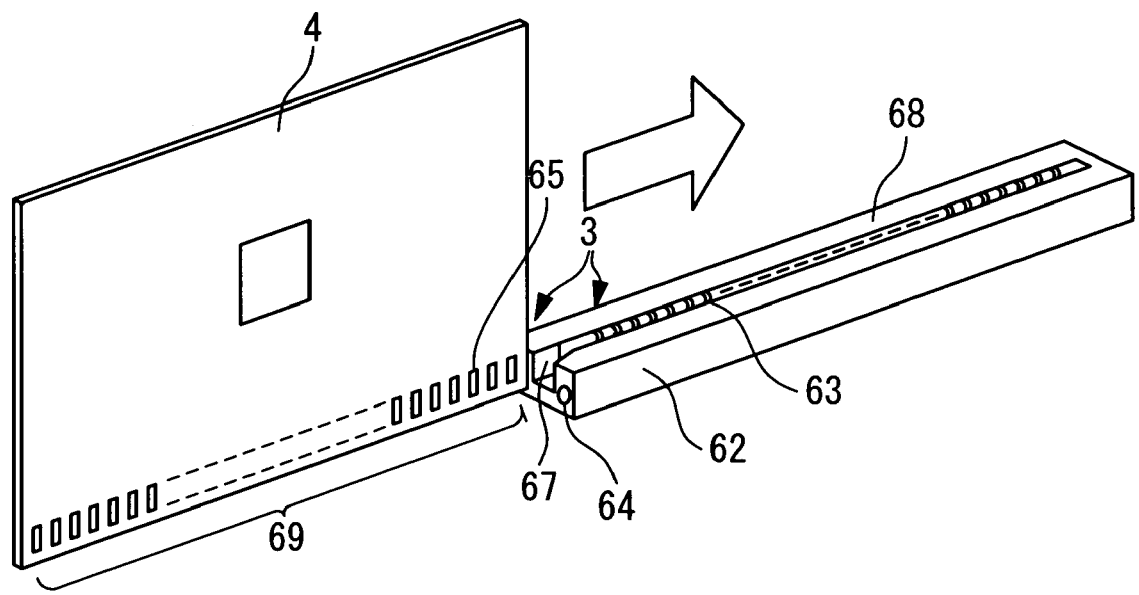
FIG. 6 is a perspective view of a connector.
Figure 7:
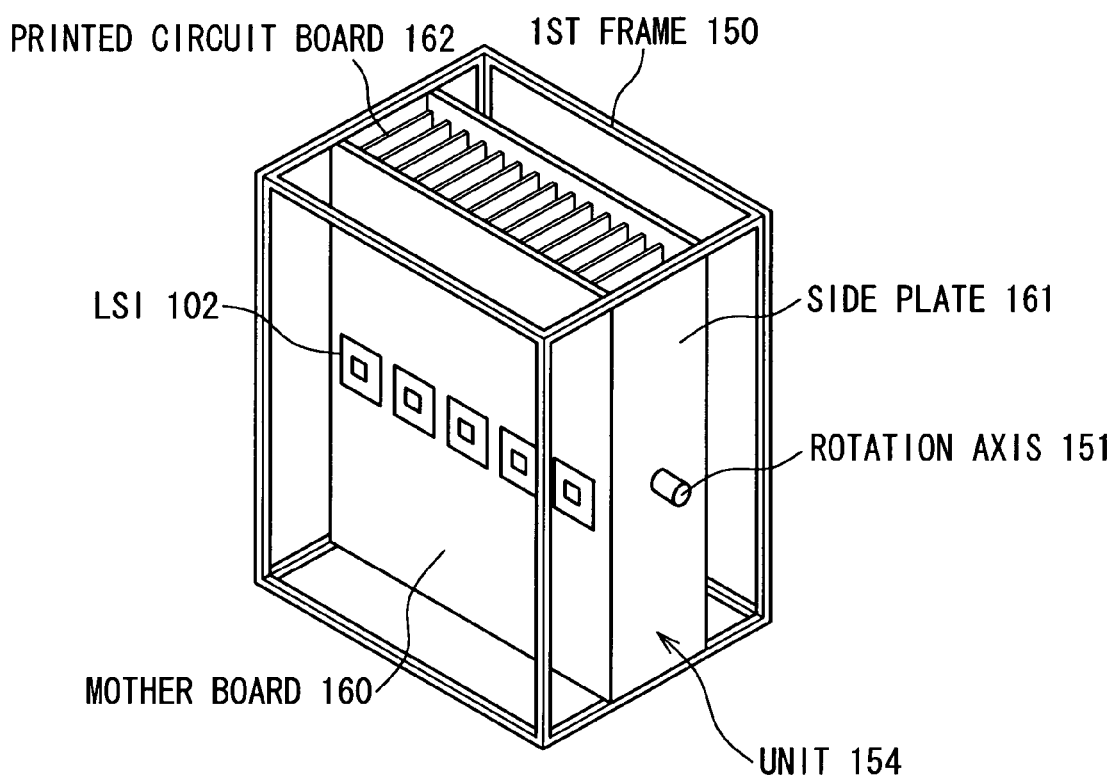
FIG. 7 is a diagram showing the entire of an electronic unit installed in a frame structure in the present invention.
Figure 8:
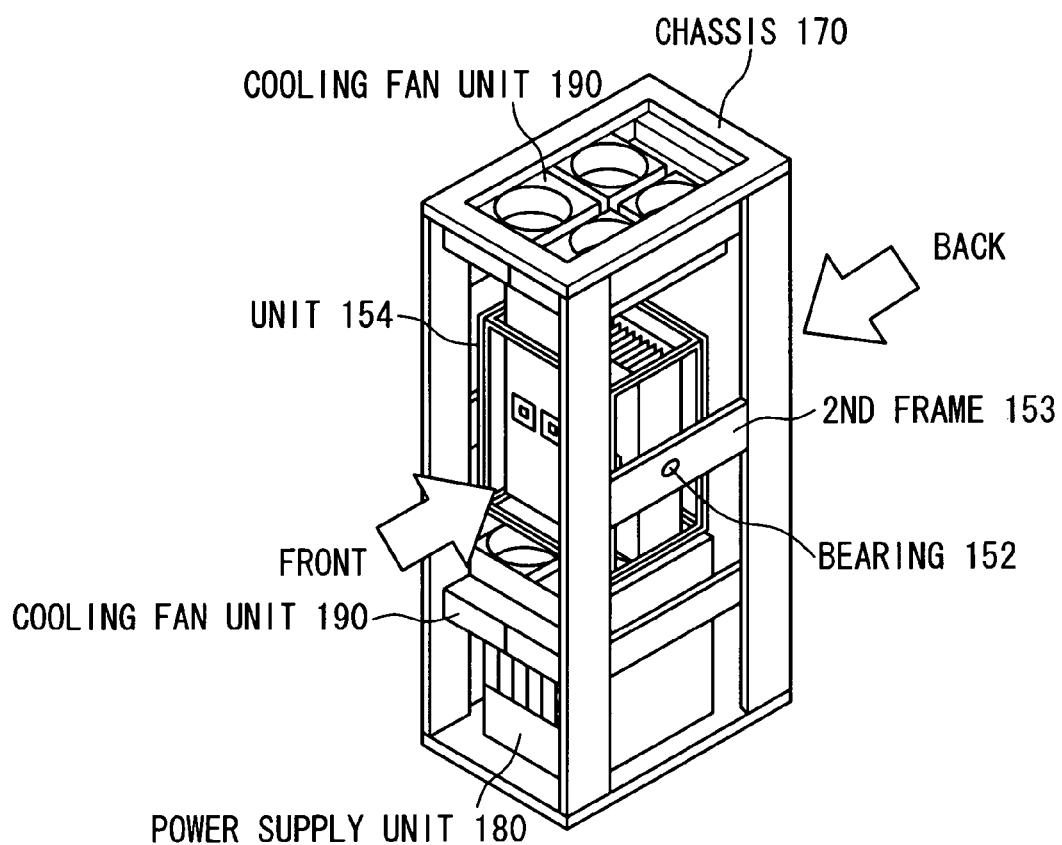
FIG. 8 is a diagram showing an accommodation apparatus accommodating the frame structure according to the first embodiment of the present invention.

FIGS. 7 and 8 are schematic diagrams showing the accommodation apparatus according to the first embodiment of the present invention. FIG. 7 shows the entire of an electronic unit installed in a first frame structure 150. The electronic unit 154 is exemplified by an above-mentioned conventional unit which needs maintenance from four planes of the unit 154. In other words, a plurality of printed circuit boards 162 are arranged between the two motherboards 160 on which have a plurality of LSIs 102. Side plates 161 are provided for the first frame structure. The side board 161 is connected to a plane including the side edges of the two motherboards 160. A rotation axis 151 as a component of a supporting mechanism is provided for the side plates 161 to pass through the center of gravity of the electronic unit 154. The entire electronic unit 154 is accommodated in the first frame structure 150 which is accommodated in the chassis 170 of the accommodation apparatus. The electronic unit 154 to be installed the first frame structure 150 needs maintenance from at least three planes of the unit 154. However, the electronic unit 154 is not limited to the above-mentioned electronic unit.

Referring to FIG. 8, bearings 152 as components of the supporting mechanism are provided in second frames 153 which are arranged on both sides of the chassis 170 of the accommodation apparatus. Thus, the electronic unit 154 is accommodated in the chassis 170. The rotation axis 151 is supported by the bearings 152. Thus, the electronic unit 154 can be rotated around the rotation axis 151 by the bearings 152 in a state that the electronic unit 154 is accommodated in the chassis 170. As for the structures of the rotation axis 151 and the bearings 152, a smoother movement is achieved by using bearings or bushes made of a metal or a nylon and the like (not shown).

In this state, the maintenance of the LSIs 102 on the surfaces of the motherboards 160 can be carried out from the front and back planes of the chassis 170 as the maintenance planes. However, when it is possible to rotate the electronic unit 154 in the chassis into the front and back directions by 90° or more, the maintenance can be carried out on only the front plane side of the accommodation apparatus.

In the operation of the electronic unit 154, a power supply unit 180 and cooling fan units 190 are installed in the chassis 170 in addition to the electronic unit 154. In this case, as shown in FIG. 8, the electronic unit 154 is fixed to the chassis 170 such that the printed circuit boards 162 can be inserted and pulled out from the unit 154 in upward and downward directions. The cooling fan units 190 are installed in the top and bottom of the chassis 170, and generate air-flows along the printed circuit boards 162 for an effective cooling effect.

Figure 9:
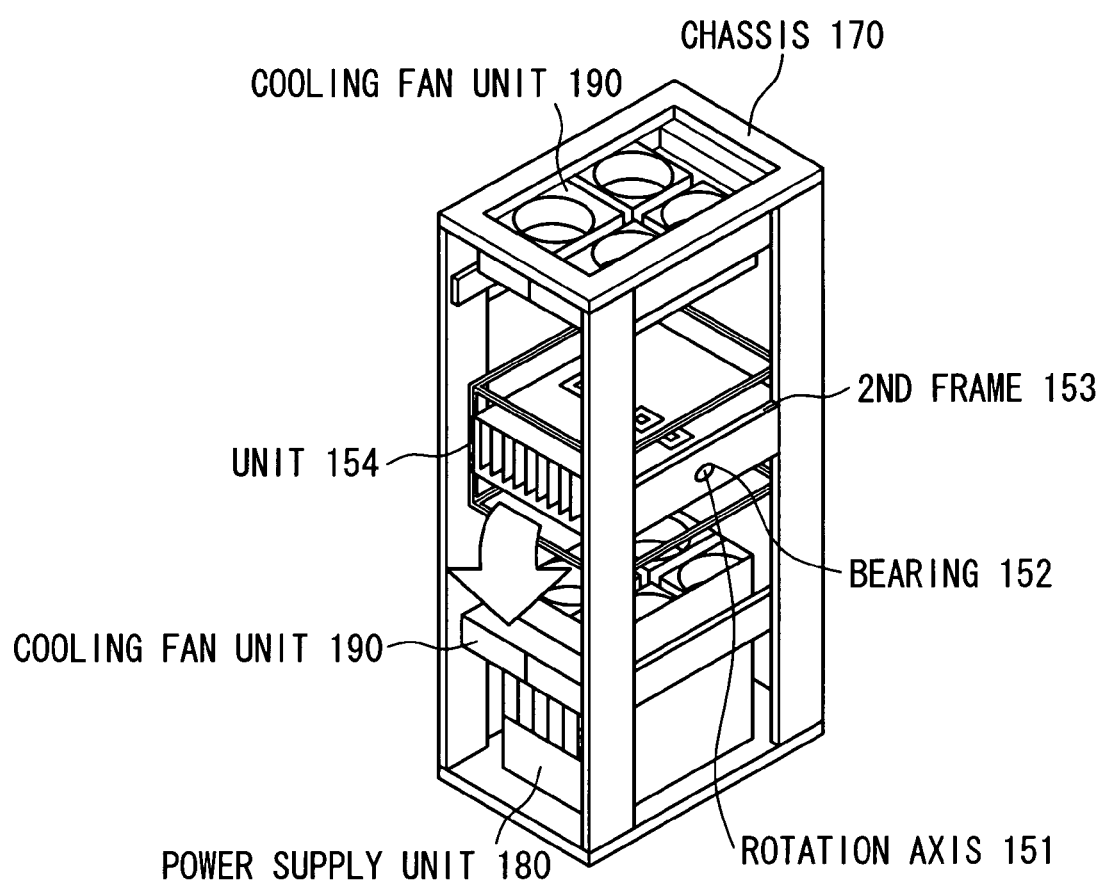
FIG. 9 is a diagram showing a state that the electronic unit is fallen down on the front side in a chassis in the first embodiment.

FIG. 9 shows a state that the electronic unit 154 is fallen down to the front direction by pulling the top end of the electronic unit 154 accommodated in the chassis 170 in the first embodiment. In this case, the rotation of the electronic unit 154 is easy since the rotation axis 151 is provided to pass through the center of the gravity of the electronic unit 154.

Figure 10:
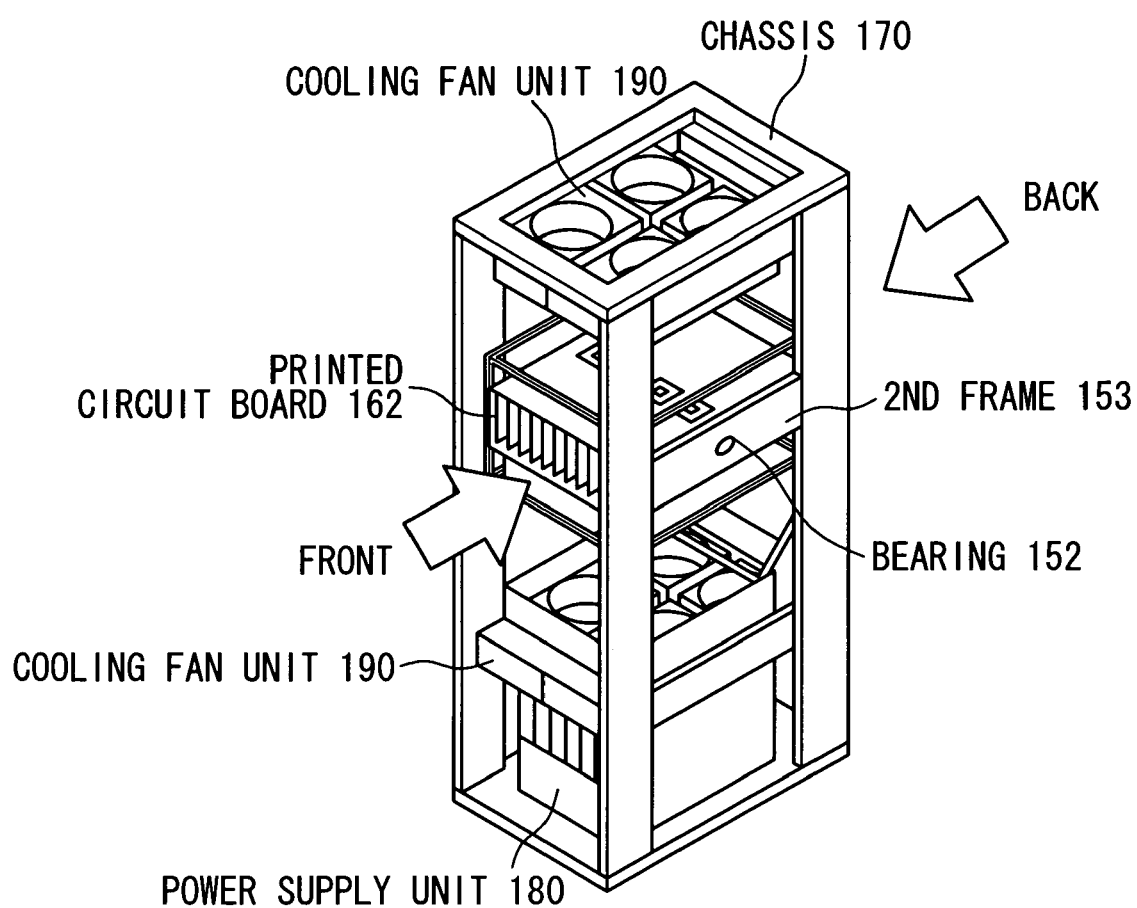
FIG. 10 is a diagram showing a state that motherboards are accessed.

FIG. 10 shows a state that the motherboards 160 are in the horizontal planes by the rotating of the electronic unit 154 by 90° from the state of FIG. 8. In this state, the maintenance of the printed circuit boards 162 between the motherboards 160 becomes possible if the front and back planes of the chassis 170 are used for the maintenance planes. In this case, since the maintenance planes of the accommodation apparatus are limited to the front and back planes, other accommodation apparatuses can be provided in adjacent in the right and left directions. As a result, the space to provide the accommodation apparatuses can be reduced.

However, when the electronic unit 154 can be rotated in each of the front and back directions by 90° or more in the chassis 170, the maintenance can be carried out on only the front side of the chassis 170. Thus, four planes of the electronic unit 154 can be maintained without increasing maintenance planes of the accommodation apparatus or the space for maintenance by adopting a mechanism for rotating the electronic unit 154 in the chassis 170.

Second Embodiment

Figure 11:
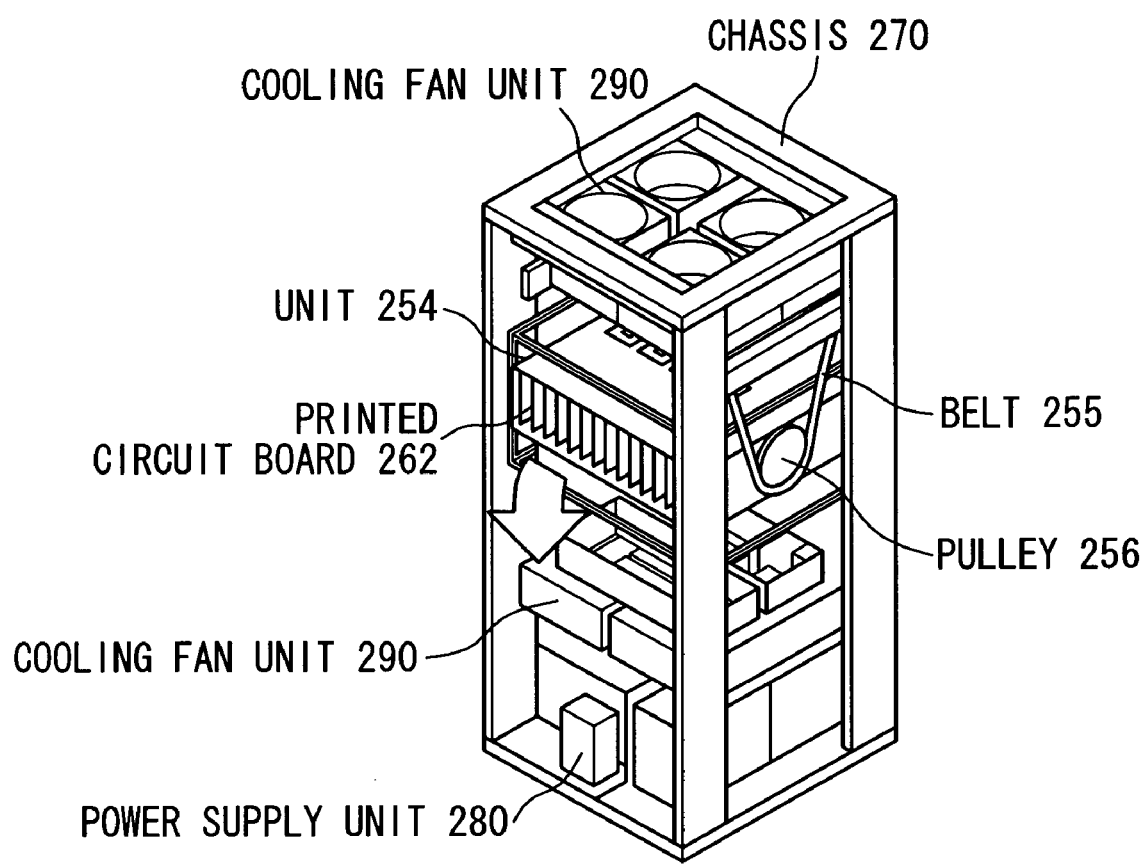
FIG. 11 is a diagram showing the accommodation apparatus according to a second embodiment of the present invention.
Figure 12:
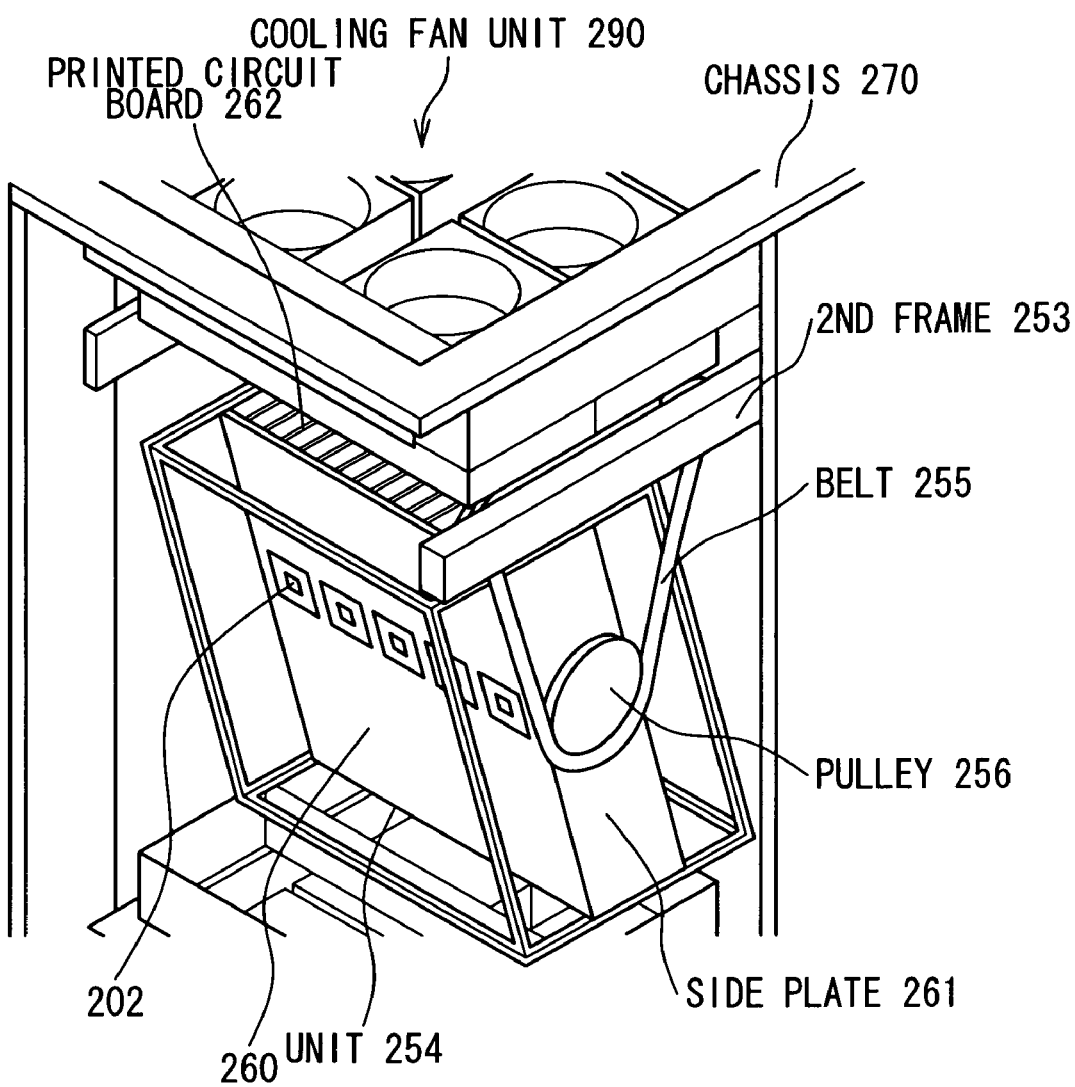
FIGS. 12 and 13 are enlarged views of a unit supporting mechanism in the second embodiment.
Figure 13:
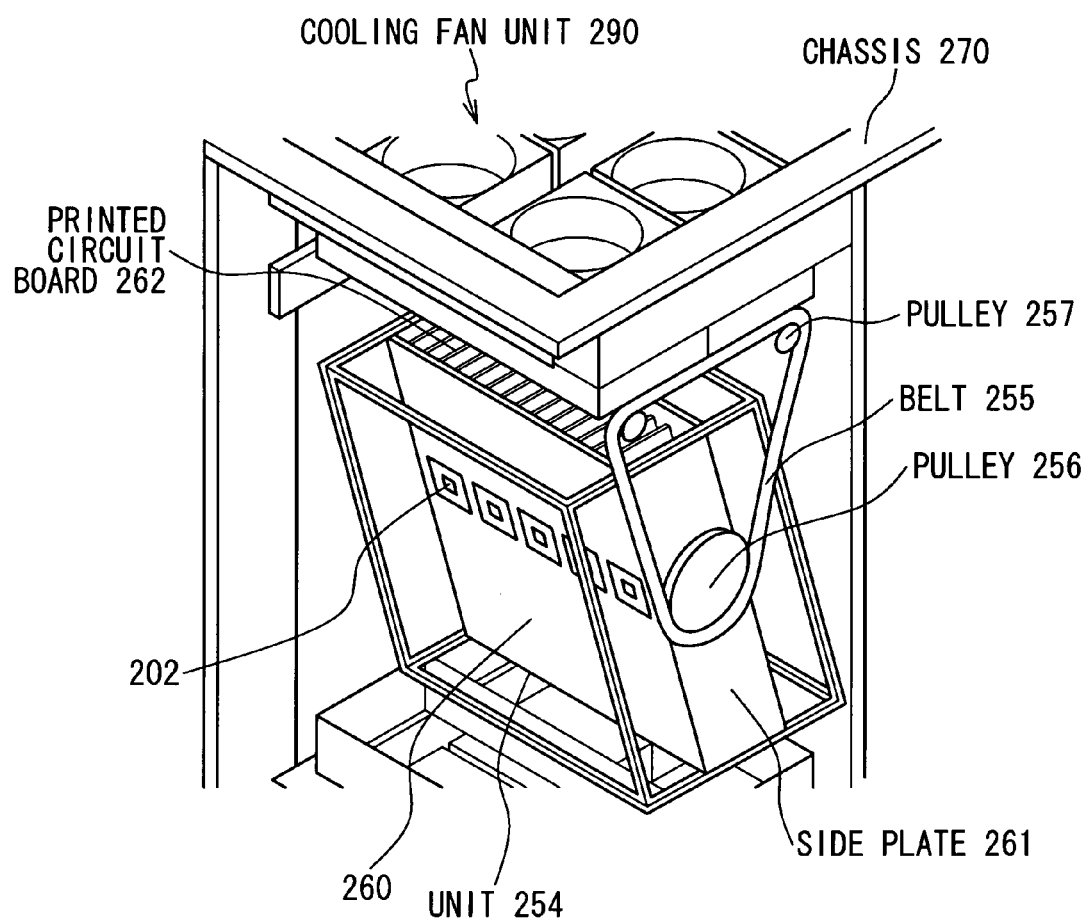

FIGS. 11 to 13 are schematic diagrams showing the accommodation apparatus according to the second embodiment of the present invention. The basic structure of the accommodation apparatus in the second embodiment is the same as that in the first embodiment other than the supporting mechanism.

FIG. 11 shows the entire of the accommodation apparatus in the second embodiment. The supporting mechanism in the first embodiment has the rotation axis and the bearings. On the other hand, in the second embodiment, the supporting mechanism has a belt 255, a first pulley 256, and second pulleys 257 (not shown in FIG. 11).

FIGS. 12 and 13 are enlarged views of the supporting mechanism in the second embodiment. The first pulley 256 is provided on the side plate 261 on the position passing through the center of the gravity of an electronic unit 254. Second frames 253 are provided in the chassis 270. The second pulleys 257 are provided on the second frame 253. In addition, the first pulley 256 is suspended by the belt 255 which is hung to the second pulleys 257. As a result, the electronic unit 254 is supported by the chassis 270. Here, the supporting mechanism may have a chain or a wire in place to the belt 255, and gearwheels in place to the pulleys in the second embodiment, although these examples are not shown. Either or all of the second pulleys 257 and the first pulley 256 are rotated, and the electronic unit 254 suspended by the belt 255 is rotated. As a result, the electronic unit 254 is rotated in a vertical plane with respect to the chassis 270.

When the motherboards 260 of the electronic unit 254 are in the horizontal state to the chassis, the front and back planes of the chassis 270 become the maintenance planes to maintain the printed circuit boards 262. Similarly, when the motherboards 260 of the electronic unit 254 are in the vertical state to the chassis, the front and back planes of the chassis 270 become the maintenance planes to maintain the LSIs 202 on the side surfaces of the motherboards 260. However, when it is possible to rotate the electronic unit 254 in the chassis in each of the front and back directions by 90° or more, the maintenance can be carried out on only the front side of the accommodation apparatus.

In this way, the maintenance of the electronic unit 254 from four planes can be carried out without increasing maintenance planes of the accommodation apparatus or the space for the maintenance by providing the mechanism for rotating the electronic unit 254 in the chassis. Also, the supporting mechanism in the second embodiment has larger area to support the weight of the electronic unit 254 than in the first embodiment. Therefore, a heavier unit can be installed in the accommodation apparatus.

Third Embodiment

Figure 14:
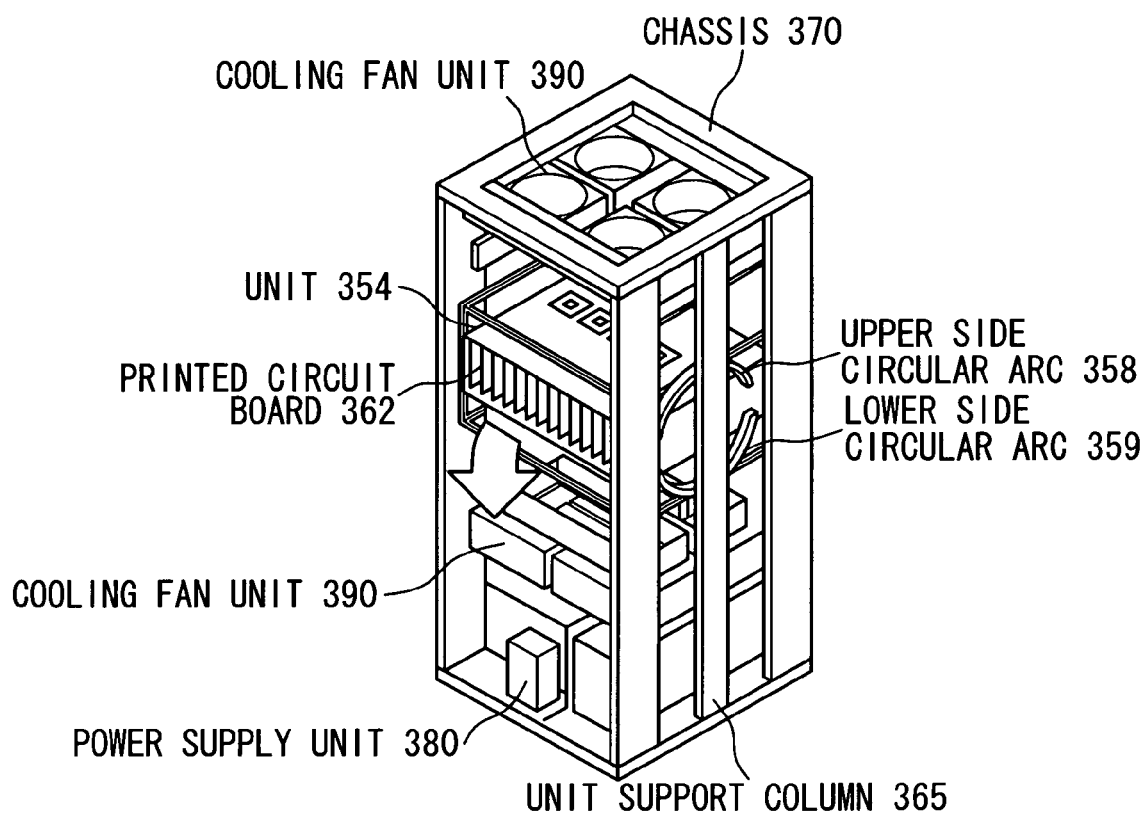
FIG. 14 is a diagram showing the accommodation apparatus according to a third embodiment of the present invention.
Figure 15:
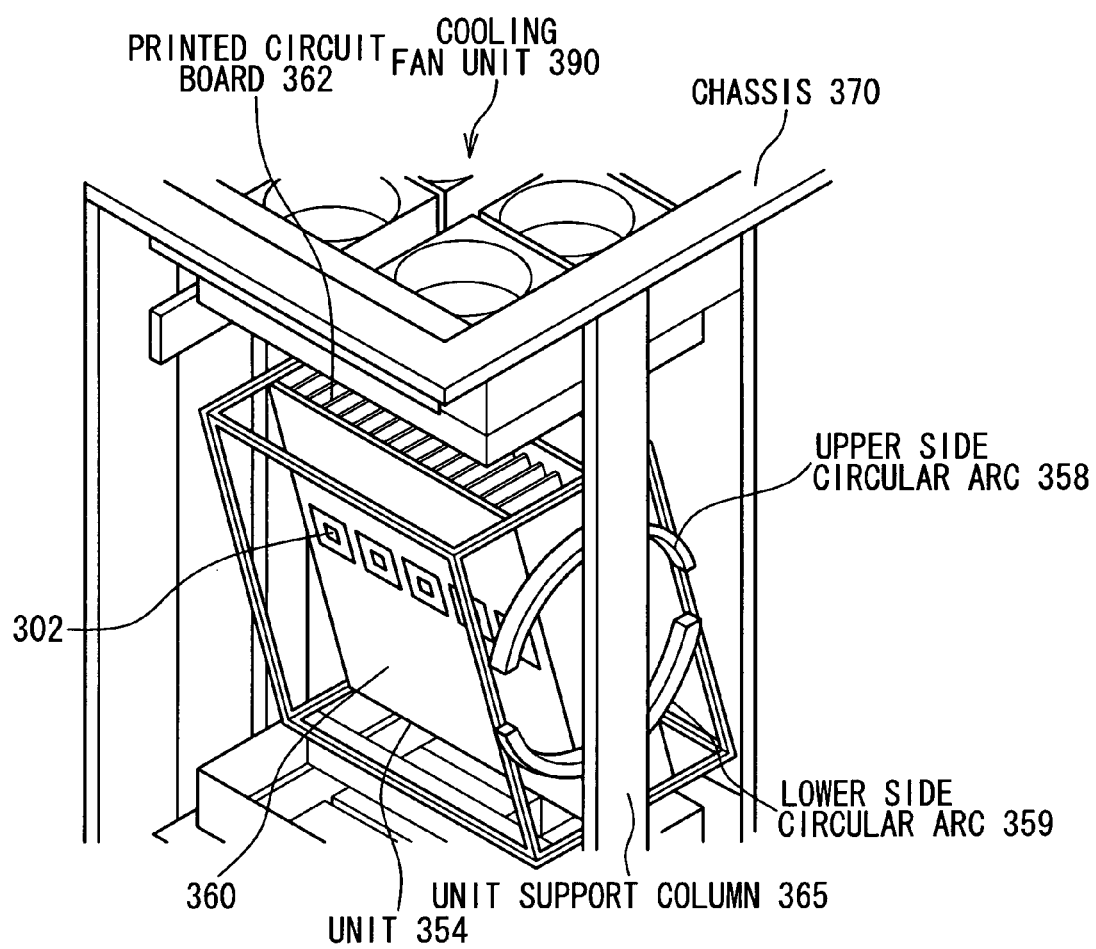
FIGS. 15 and 16 are enlarged views of the unit supporting mechanism in the third embodiment.
Figure 16:
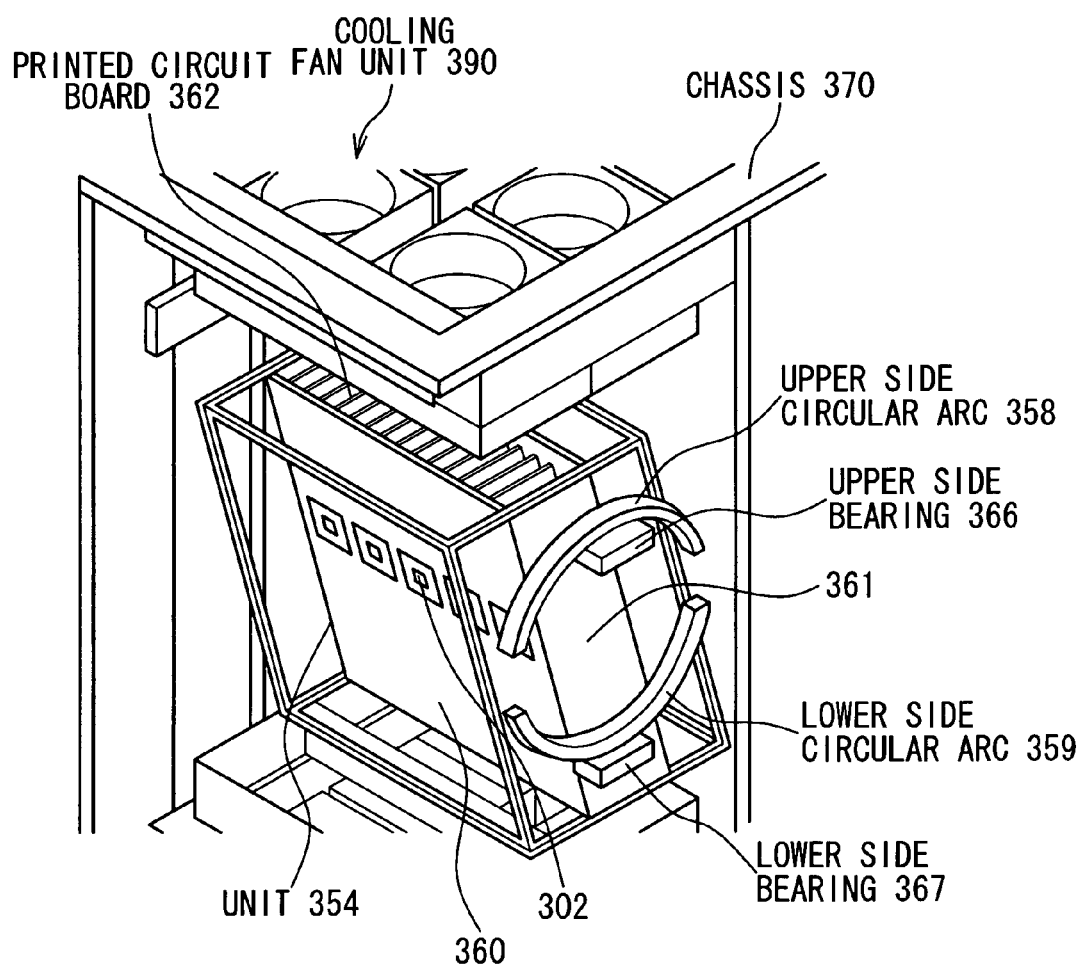

FIGS. 14 to 16 are schematic diagrams showing the accommodation apparatus according to the third embodiment of the present invention. The basic structure of the accommodation apparatus in the third embodiment is the same as those in the first and second embodiments other than the supporting mechanism.

FIG. 14 shows the entire view of the accommodation apparatus in the third embodiment. The accommodation apparatus in the first embodiment has the rotation axis and the bearings as the supporting mechanism. On the other hand, in the third embodiment, the supporting mechanism has circular arc axis 358 and 359, and bearings 366 and 367.

FIGS. 15 and 16 are enlarged views of the supporting mechanism in the third embodiment. The upper side circular arc 358 and the lower side circular arc 359 are provided on the side plate 361 such that a center of the upper side circular arc 358 and the lower side circular arc 359 passes through is coincident with the center of the gravity of the electronic unit 254. Two supporting columns 365 are provided for a chassis 370 to oppose to each other. An upper side bearing 366 to support the upper side circular arc 358 and a lower side bearing 367 to support the lower side circular arc 359 are respectively provided on the two supporting columns 365. An upper surface of the upper side bearing 366 has a same curvature radius as that of the under surface of the upper side circular arc 358. Similarly, an upper surface of the lower side bearing 367 has a same curvature radius as that of the under surface of the lower side circular arc 359. The upper side circular arc 358 and the lower side circular arc 359 provided on the side plate 361 slide on the upper side bearing 366 and the lower side bearing 367. As a result, the electronic unit 354 is rotated in a vertical plane with respect to the chassis 370. In this case, the upper side circular arc 358 and the lower side circular arc 359 have enough long to satisfy a rotating angle of the electronic unit 354 respectively.

When the motherboards 360 of the electronic unit 354 is in the horizontal state to the chassis 370, the front and back planes of the chassis 370 become the maintenance planes to maintain the printed circuit boards 362. Similarly, when the motherboards 360 of the electronic unit 354 is in the vertical state to the chassis 370, the front and back planes of the chassis 370 become the maintenance planes to maintain the LSIs 302 on the surfaces of the motherboards 360. However, when it is possible to rotate the electronic unit 354 in the chassis 370 into each of the front and back directions by 90° or more, the maintenance can be carried out at only the front plane of the accommodation apparatus.

In this way, four planes of the electronic unit 354 can be maintained without increasing maintenance planes of the accommodation apparatus or the space for the maintenance by providing the mechanism for rotating the electronic unit 354 in the chassis 370. Also, the supporting mechanism in the third embodiment has larger area than that of the rotation axis 151 shown in the first embodiment to support the weight of the electronic unit 354. Therefore, a heavier electronic unit can be installed in the accommodation apparatus.

Moreover, the upper side circular arc 358 and the lower side circular arc 359 may not necessarily be supported by the upper side bearing 366 and the lower side bearing 367, respectively. That is, as shown in FIGS. 17A to 18B, the upper side circular arc 358 and the lower side circular arc 359 may be supported through balls 368, a cylindrical member 369 or a spacer.

Here, the mechanism providing the balls 368 between the lower side circular arc 359 and the lower side bearing 367 will be described. This is also applied to the upper side circular arc 358 and the upper side bearing 366.

Moreover, FIG. 17A is a cross sectional view the support mechanism on the perpendicular plane to the rotation axis. FIG. 17B is a cross sectional view of the support mechanism provided with the balls 368 between the lower side circular arc 359a and the lower side bearing 367a on the vertical plane including the rotation axis. Referring to FIGS. 17A and 17B, the plurality of balls 368 are provided between the lower side circular arc 359a and the lower side bearing 367a, and arc grooves are formed in the opposing surfaces of the lower side circular arc 359a and the lower side bearing 367a.

The rotation of the electronic unit 354 becomes smoother by providing the plurality of balls 368.

Figures 18A, 18B:
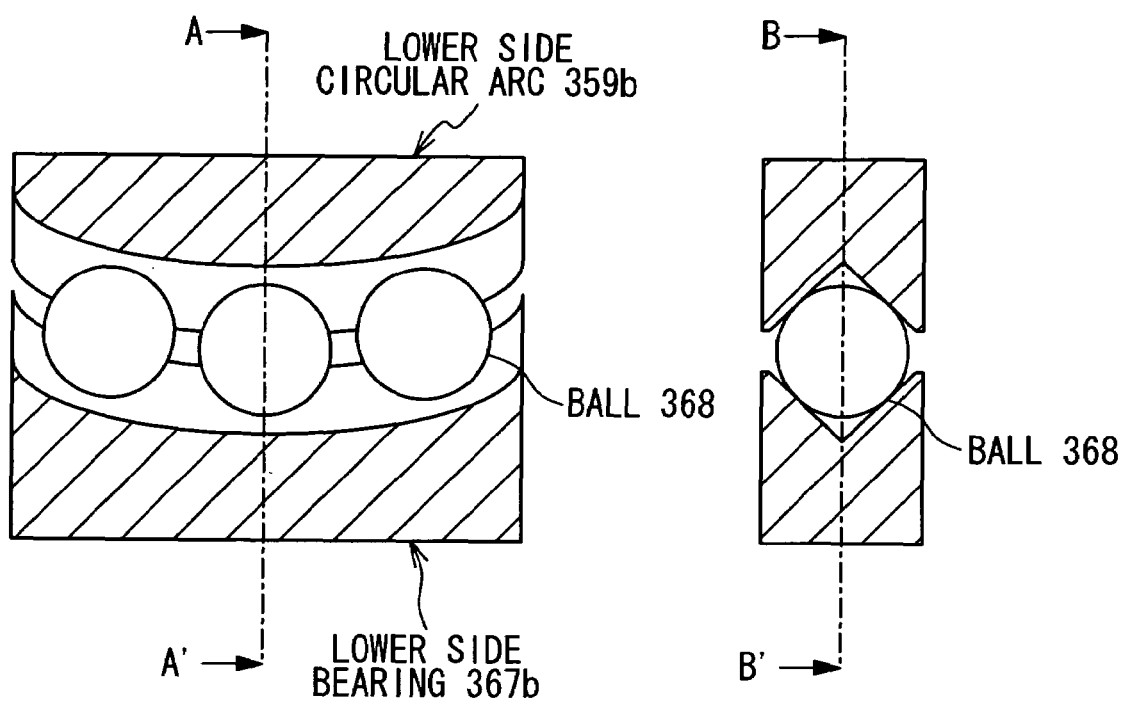
FIGS. 18A and 18B are cross sectional views of another example of the support mechanism.

FIG. 18A is a cross sectional view the support mechanism on the perpendicular plane to the rotation axis. FIG. 18B is a cross sectional view of the support mechanism provided with the balls 368 between the lower side circular arc 359*a* and the lower side bearing 367*a* on the vertical plane including the rotation axis. Here, grooves shown in FIG. 18B are different from those shown in FIG. 17B. In FIG. 17B, the arc grooves are formed on the opposing surfaces of the lower side circular arc 359*a* and the lower side bearing 367*a*. On the other hand, the grooves shown in FIG. 18B are formed in cuneal in this example. The plurality of balls 368 are provided between the lower side circular arc 359*b* and the lower side bearing 367*b*. Thus, the rotation of the electronic unit 354 becomes smoother by providing the plurality of balls 368.

Figure 19A:
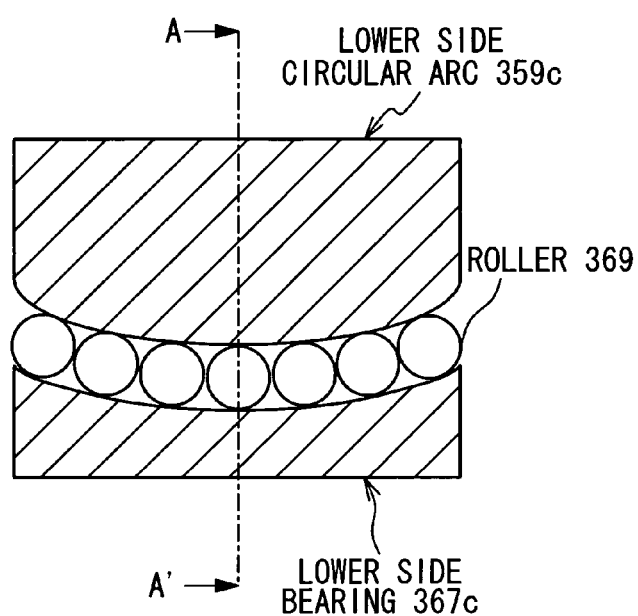
FIGS. 19A and 19B are cross sectional views of another example of the support mechanism.
Figure 19B:
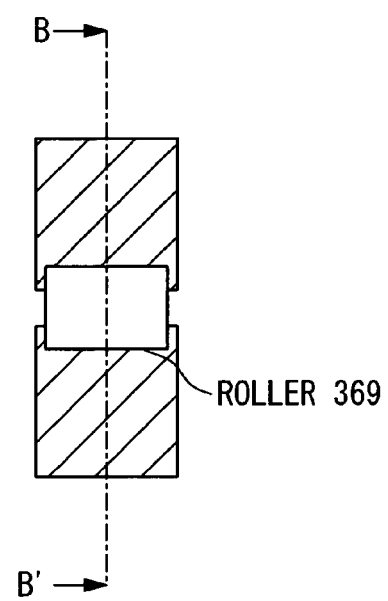

FIG. 19A is a cross sectional view of the mechanism provided with a plurality of rollers 369 between the lower side circular arc 359*c* and the lower side bearing 367*c* on the perpendicular plane to the rotation axis. Also, FIG. 19B is a cross sectional view of the mechanism on the vertical plane including the rotation axis. The plurality of rollers 369 are provided between the lower side circular arc 359*c* and the lower side bearing 367*c*, and thus, the rotation of the electronic unit 354 becomes smoother.

Figure 20A:
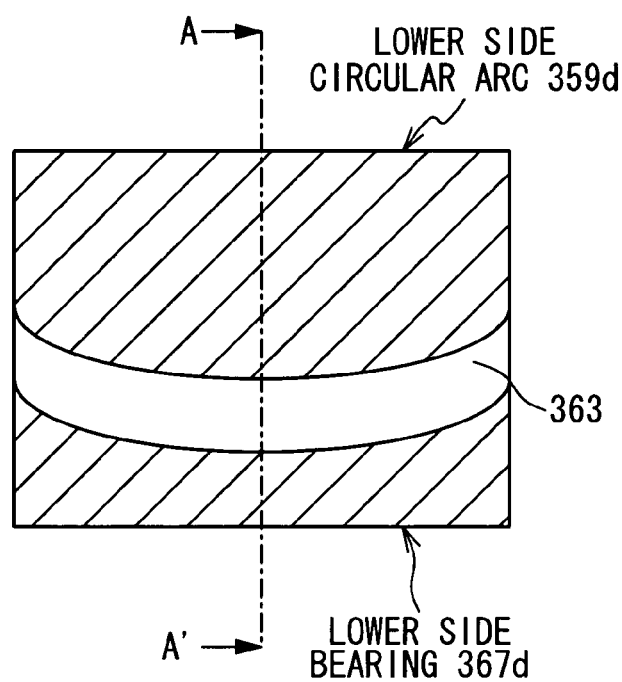
FIGS. 20A and 20B are cross sectional views of another example of the support mechanism.
Figure 20B:
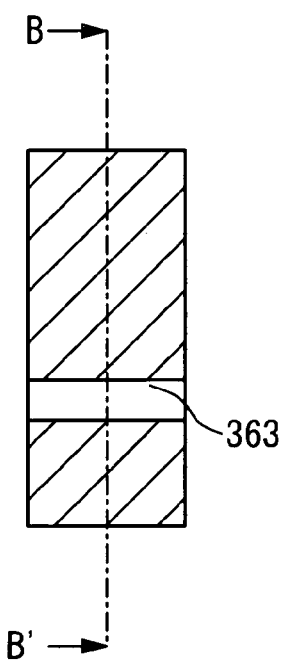

FIG. 20A is a cross sectional view of the mechanism provided with a spacer 370 between the lower side circular arc 359*d* and the lower side bearing 367*d* on the perpendicular plane to the rotation axis. Also, FIG. 20B is a cross sectional view of the mechanism on the vertical plane including the rotation axis. The spacer 370 is provided between the lower side circular arc 359*d* and the lower side bearing 367*d*, and thus, the rotation of the electronic unit 354 becomes smoother.

It should be noted that in the third embodiment, the circular arc is used. However, a circle with no notch between the upper side circular arc 358 and the lower side circular arc 359 may be used.

Fourth Embodiment

FIGS. 21-24 are schematic diagrams showing the accommodation apparatus according to the fourth embodiment of the present invention. In the basic structure of the accommodation apparatus in the fourth embodiment, an electronic unit 454 is supported by the first frame structure which is supported by the second frame structure 472. Also, the second frame structure 472 is movably slid out from the chassis 470 by using slide rails 471.

Figure 21:
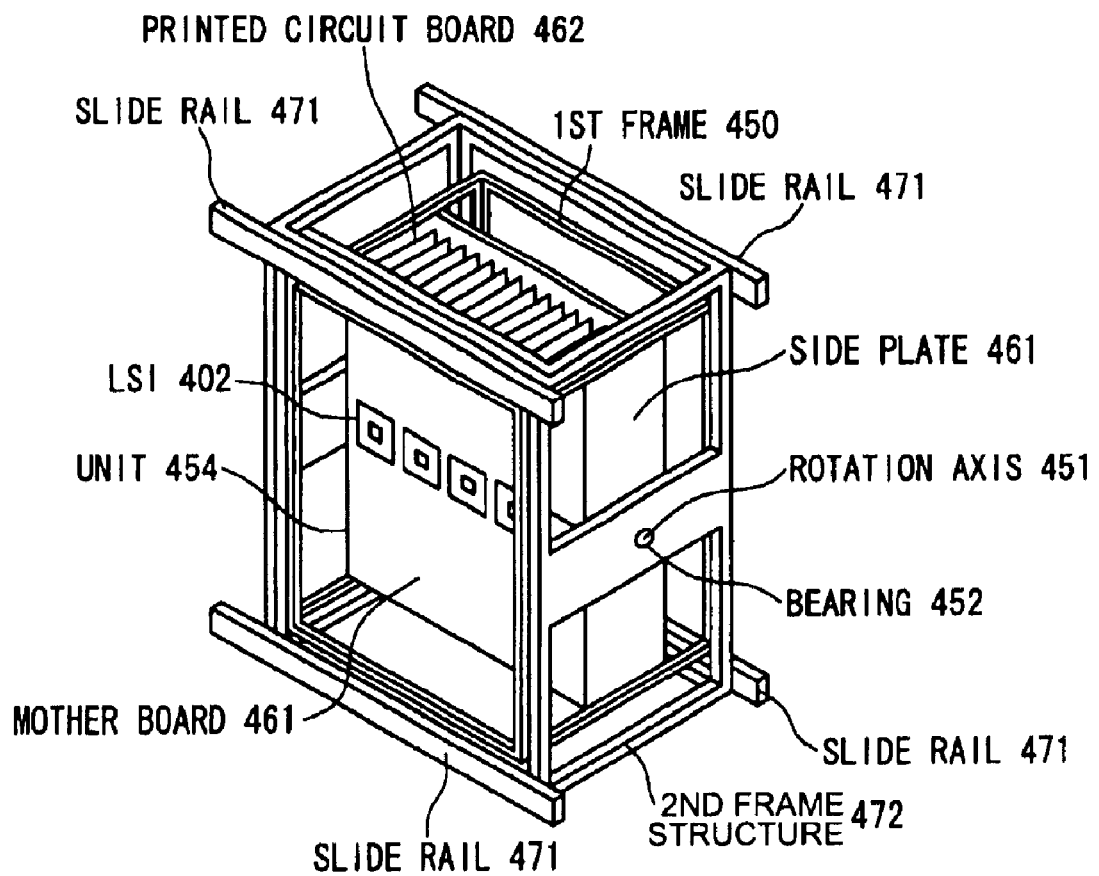
FIG. 21 is a diagram showing the electronic unit in a fourth embodiment of the present invention.

FIG. 21 shows the whole structure of the electronic unit 454 in the fourth embodiment. The electronic unit 454 is the same as the electronic unit 154 in the first embodiment. The electronic unit 454 is not installed directly in the chassis 470 but installed in the first frame structure which is accommodated in the second frame structure 472 with bearings 452. The rotation axis 451 of the electronic unit 454 as a component of the supporting mechanism is arranged to be received by the bearings 452 of the second frame structure 472 as another component of the supporting mechanism, and the electronic unit 454 can be rotated around the rotation axis 451 in the second frame structure 472. Moreover, a fixing section of the slide rails 471 that can be expanded and contracted is provided for the chassis 470, and a moving section of the slide rails 471 is provided for the second frame structure 472. As a result, the electronic unit 454 can be accommodated in the chassis 470 in a state that the electronic unit 454 is installed in the first frame structure which is accommodated in the second frame structure 472, and can be pulled out in front of the chassis 470.

Figure 22:
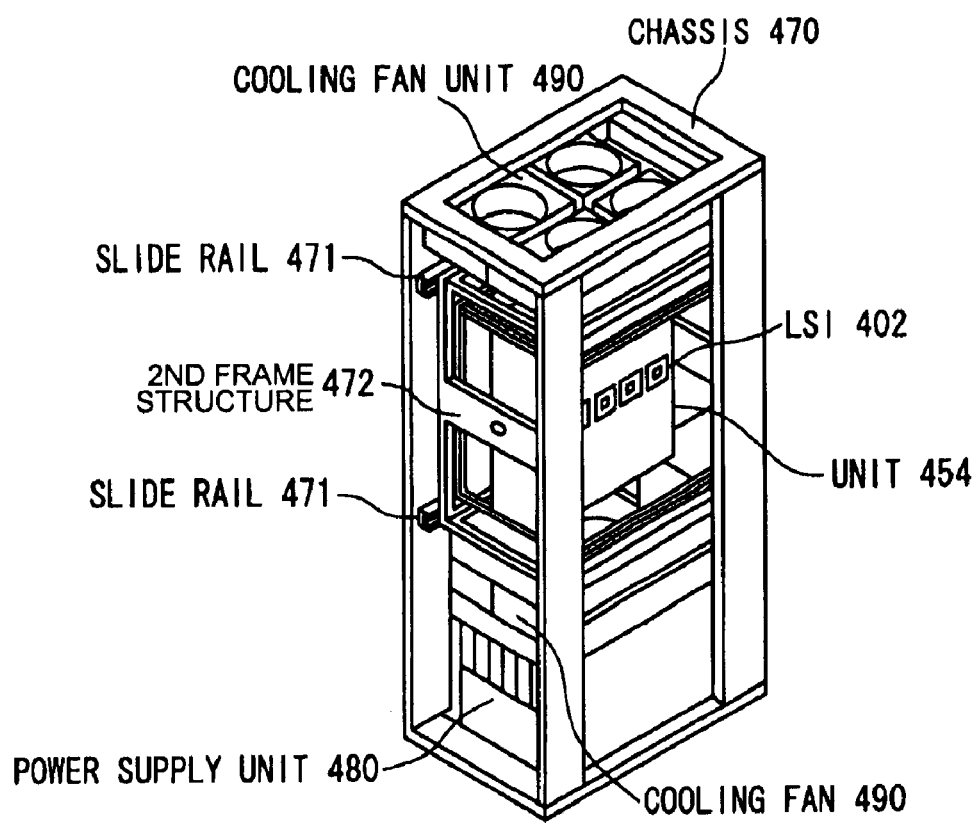
FIG. 22 is a diagram showing the accommodation apparatus accommodating the electronic unit according to the fourth embodiment of the present invention.

FIG. 22 shows the entire view of the accommodation apparatus in the fourth embodiment. The accommodation apparatus includes the second frame structure 472 with the rotation axis 451 and the bearings 452. As a result, the electronic unit 454 can be rotated around a horizontal rotation axis 451 of the second frame structure 472. Also, the electronic unit 454 installed in the second frame structure 472 can be pulled out in front of the chassis 470 by using the slide rails 471.

Figure 23:
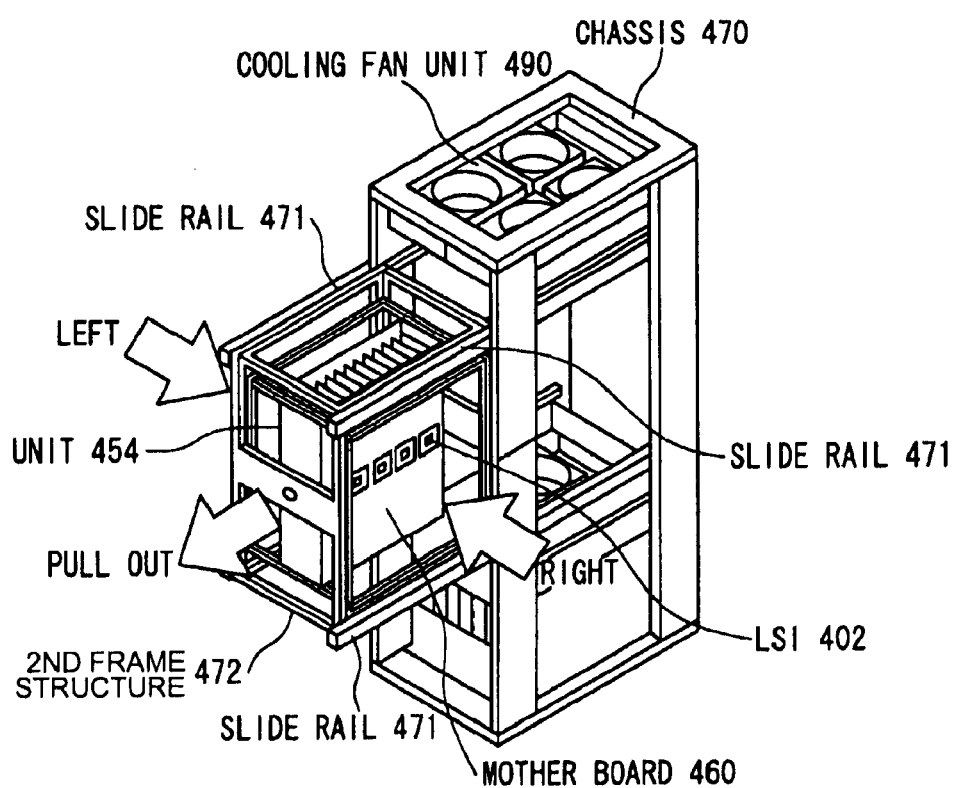
FIG. 23 is a diagram showing a state that the electronic unit is pulled out in front of the chassis by using slide rails in the fourth embodiment.

FIG. 23 shows the electronic unit 454 pulled out in front of the chassis 470 by using the slide rails 471. At this time, motherboards 460 in the electronic unit 454 are supported in the vertical direction. In such a state, LSIs 402 on the surface of the motherboard 460 can be maintained. It should be noted that the electronic unit 454 may be installed so that the LSI-mounted plane of the motherboard 460 is directed to the front of the chassis 470 in the second frame structure 472.

Figure 24:
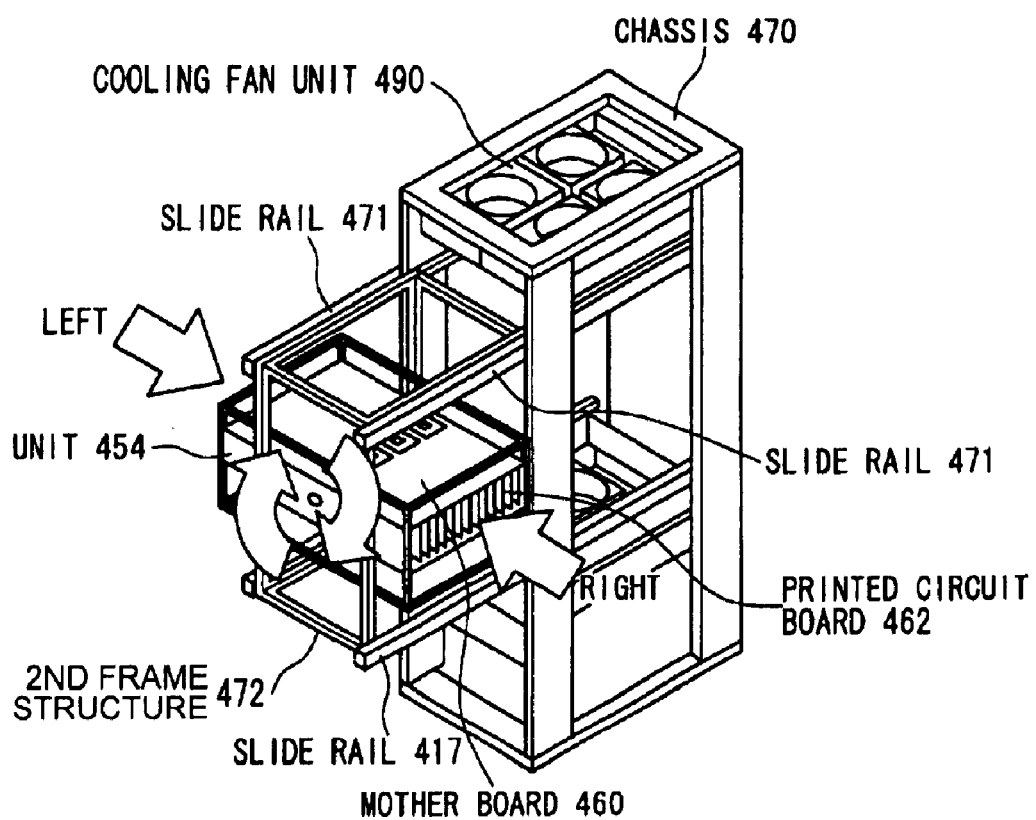
FIG. 24 is a diagram showing a state that the pulled out electronic unit is rotated in the fourth embodiment.

FIG. 24 shows the electronic unit 454 pulled out in front of the chassis 470 is rotated by 90°, so that the motherboards 460 are supported in the horizontal state. In such a state, printed circuit boards 462 can be maintained.

In the fourth embodiment, the electronic unit 454 is pulled out in front of the chassis 470 keeping the unit 454 being accommodated in the second frame structure 472. Also, the electronic unit 454 can be rotated in the second frame structure 472. As a result, four planes of the electronic unit 454 can be maintained even if the maintenance plane of the accommodation apparatus is a front single plane.

Also, the direction of the pulling out of the second frame structure 472 is approximately orthogonal to the direction of the rotation of the electronic unit 454 in the second frame structure 472. That is, the direction of the pulling out of the second frame structure 472 is approximately parallel to the direction of the rotation axis of the electronic unit 454 in the second frame structure 472. Therefore, the maintenance space in front of the accommodation apparatus becomes minimum for the direction of pulling out of the second frame structure 472.

In this way, the maintenance can be carried out at only the front plane of the chassis 470 though the maintenance is carried out in the front and back planes of the chassis in the first to second embodiments.

Fifth Embodiment

Figure 25:
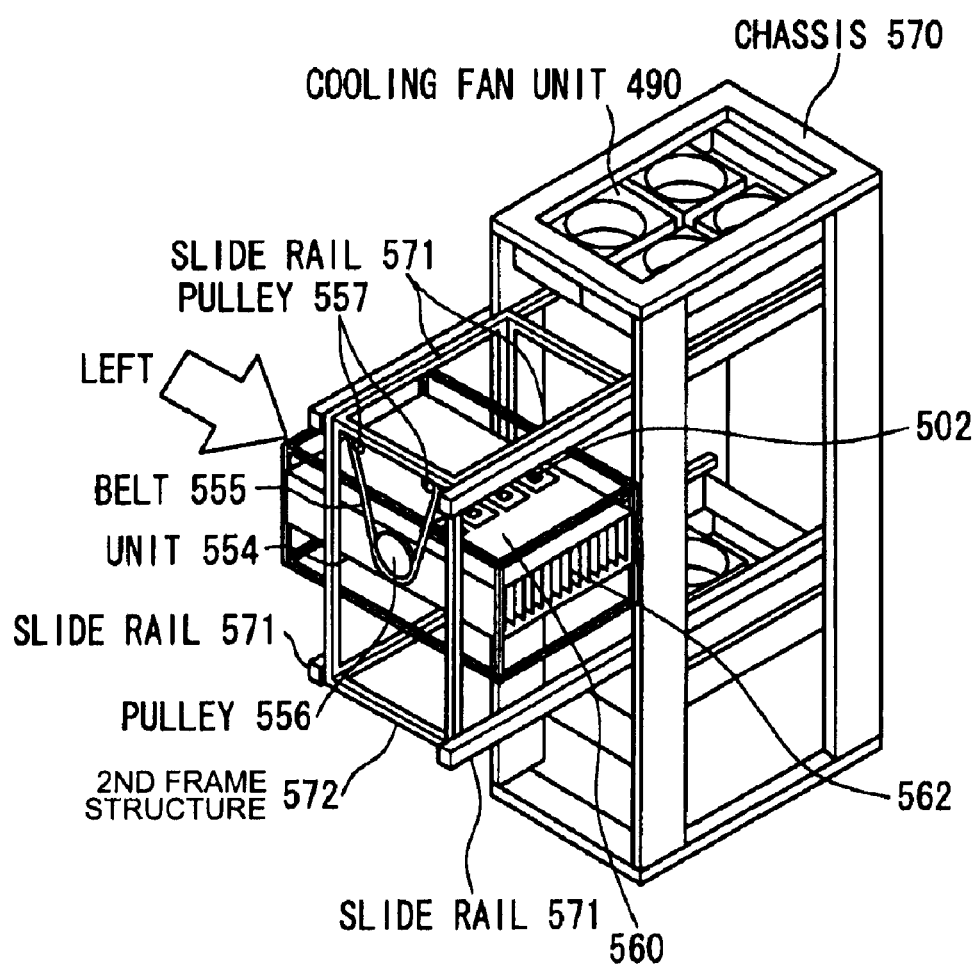
FIG. 25 is a diagram showing a state that the pulled out electronic unit is rotated in a fifth fourth embodiment.

FIG. 25 is a schematic diagram showing the accommodation apparatus according to the fifth embodiment of the present invention. The basic structure of the accommodation apparatus in the fifth embodiment is the same as that in the fourth embodiment other than the supporting mechanism.

As shown in FIG. 25, the supporting mechanism has a belt 555, a first pulley 556, and second pulleys 557. Therefore, the electronic unit 554 can be rotated in the second frame structure 572. The accommodation apparatus further has slide rails 571. Therefore, the electronic unit 554 can be pulled out in front of the chassis 570 accommodated in the second frame structure 572 by using the slide rails 571. Also, as shown in FIG. 8, the electronic unit 554 is rotated in the second frame structure in the same manner as the electronic unit 254 in the second embodiment. Moreover, the second frame structure 572 accommodating the first frame structure which accommodates the electronic unit 554 is pulled out from the chassis 570 in the same manner in the fourth embodiment.

It should be noted that the electronic unit 554 may be installed so that the LSI-mounted surface of the motherboard is directed to the front of the chassis in the second frame structure 572.

Also, in the fifth embodiment, the electronic unit 554 is pulled out in front of the chassis 570. The printed circuit board 562 can be maintained in the state that the motherboards 560 are in the horizontal state. Moreover, the electronic unit 554 pulled out in front of the chassis 570 is rotated by 90°, and the motherboards 560 are supported in the vertical state. In such a state, the maintenance of the LSIs 502 on the surfaces of the motherboards 560 can be carried out.

As mentioned above, the electronic unit 554 is pulled out in front of the chassis 570. Moreover, the electronic unit 554 pulled out can be rotated around the horizontal axis. As a result, four planes of the electronic unit 554 can be maintained even if the maintenance plane of the accommodation apparatus is only a single front plane.

In addition, the direction of the pulling out of the second frame structure 572 is approximately orthogonal to the direction of the rotation of the electronic unit 554 in the second frame structure 572. That is, the direction of the pulling out of the second frame structure 572 is approximately parallel to the rotation axis of the electronic unit 554 in the second frame structure 572. Therefore, the maintenance plane in front of the chassis becomes minimum for the direction of pulling out of the second frame structure 572.

In this way, the maintenance can be carried out at only the front plane of the chassis 570 in the fourth embodiment though the maintenance is carried out at the front and back planes of the chassis in the first to third embodiments.

Sixth Embodiment

Figure 26:
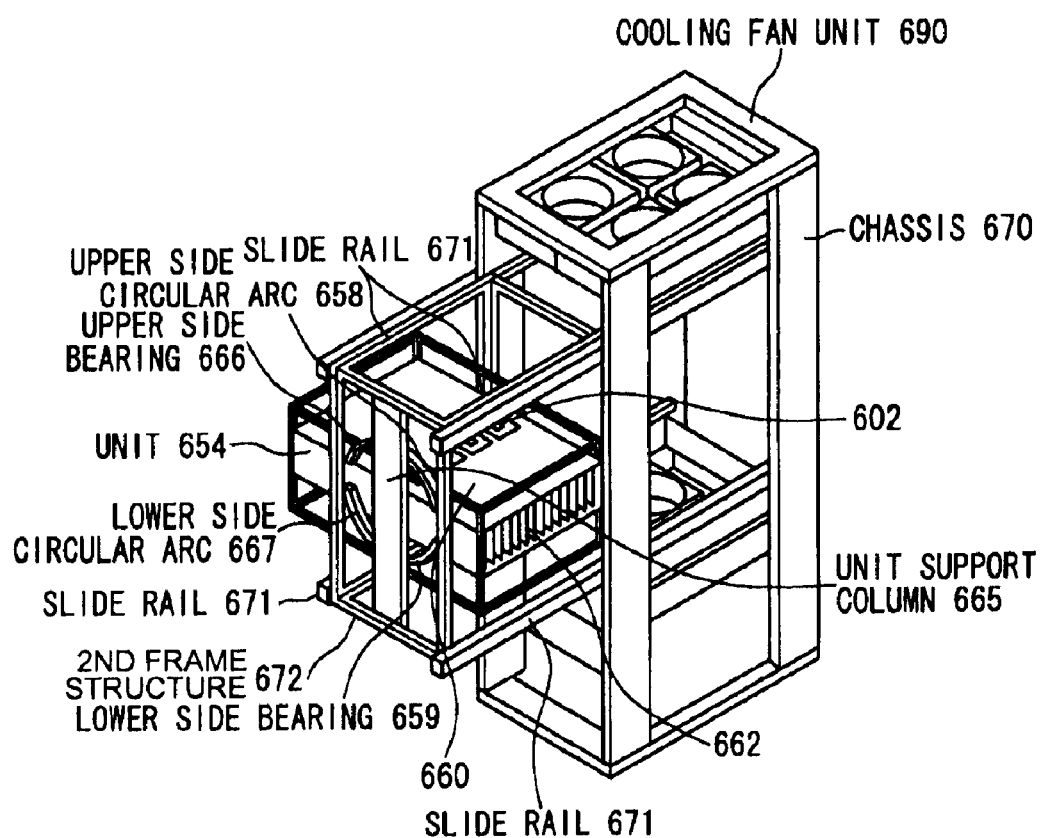
FIG. 26 is a diagram showing a state that the pulled out electronic unit is rotated in a sixth embodiment.

FIG. 26 is a schematic diagram showing the accommodation apparatus according to the sixth embodiment of the present invention. The basic structure of the accommodation apparatus in the sixth embodiment is the same as in the fourth embodiment other than the supporting mechanism.

As shown in FIG. 26, the supporting mechanism has an upper side circular arc 658, a lower side circular arc 659, upper side bearings 666, and lower side bearings 667. As a result, the electronic unit 654 can be rotated in the second frame structure 672. The accommodation apparatus further has slide rails 671. Therefore, the electronic unit 654 can be pulled out in front of the chassis 670 in the state installed in the first frame structure which is accommodated in the second frame structure 672 by using the slide rails 671. Also, as shown in FIG. 26, the electronic unit 654 is rotated in the second frame structure in the same manner as the electronic unit 354 in the third embodiment. Moreover, the second frame structure 672 accommodating the electronic unit 654 is pulled out from the chassis 670 in the same manner in the fourth embodiment.

It should be noted that the electronic unit 654 may be installed so that the LSI-mounted surface of the motherboard is directed to the front of the chassis in the second frame structure 672. Further, the circular arcs may be replaced by a circle as the supporting mechanism that has no notch between the upper side circular arc 658 and the lower side circular arc 659.

In the sixth embodiment, the electronic unit 654 is pulled out in front of the chassis 670. The printed circuit boards 662 can be maintained in the state that the motherboards 660 are in the horizontal state. Moreover, the electronic unit 654 pulled out in front of the chassis 670 is rotated by 90° and the motherboards 660 are supported in the vertical state. In such a state, the maintenance of the LSI 602 on the surface of the motherboard 660 can be carried out.

As mentioned above, the electronic unit 654 is pulled out in front of the chassis 670. Moreover, the electronic unit 654 can be rotated around the horizontal axis in the state pulled out. As a result, four planes of the electronic unit 654 can be maintained only at a single front plane of the chassis 670.

In addition, the direction of the pulling out of the second frame structure 672 is approximately orthogonal to the direction of the rotation of the electronic unit 654 in the second frame structure 672. That is, the direction of the pulling out of the second frame structure 672 is approximately parallel to the rotation axis of the electronic unit 654 in the second frame structure 672. Therefore, the maintenance plane in front of the chassis 670 becomes minimum for the direction of pulling out of the second frame structure 672.

In this way, the maintenance can be carried out at only the front plane of the chassis 670 in the fifth embodiment though the maintenance is carried out at the front and back planes of the chassis in the first to third embodiments.

According to the present invention, the electronic unit with maintenance planes of three or more is supported by the chassis of the accommodation apparatus. The maintenance plane of the electronic unit to the chassis can be changed by the supporting mechanism. Therefore, the electronic unit provided in the chassis is efficiently maintained. Moreover, it needs only a small space for the maintenance.

What is claimed is:

1. An accommodation apparatus accommodating a unit which needs maintance from at least three planes, comprising:
   a chassis;
   a first frame structure configured to accommodate said unit; and
   a supporting mechanism coupled to said first frame structure and said chassis to support said first frame structure to said chassis such that at least one of attitude and position of said unit
   is changeable with respect to said chassis facilitating access to the unit to provide said maintance,
   wherein said supporting mechanism rotatably supports said first frame structure.

2. The accommodation apparatus according to claim 1, wherein said supporting mechanism comprises:
   a rotation axis coupled to said first frame structure; and
   bearings coupled to said chassis to receive said rotation axis, and
   said rotation axis passes through a center of gravity of said unit.

3. The accommodation apparatus according to claim 2, wherein said chassis further comprises:
   a second frame structure configured to accommodate said first frame structure; and
   slide rails configured to allow said second frame structure to slide on said slide rails such that said unit is pulled out, and
   said bearings are provided for said second frame structure.

4. The accommodation apparatus according to claim 1, wherein said supporting mechanism comprises:
   a first pulley coupled to said first frame structure and provided on a rotation axis passing through a center of gravity of said unit;
   second pulleys coupled to said chassis; and
   a torque transfer member hung to said first and second pulleys, and
   said first pulley is communicated with said second pulleys by said torque transfer member.

5. The accommodation apparatus according to claim 4, wherein said chassis further comprises:

a second frame structure configured to accommodate said first frame structure; and slide rails configured to allow said second frame structure to slide on said slide rails such that said unit is pulled out, and said second pulleys are provided for said second frame structure.

6. The accommodation apparatus according to claim 4, wherein said torque transfer member is a belt or a wire.

7. The accommodation apparatus according to claim 1, wherein said supporting mechanism comprises:

a first gearwheel coupled to said first frame structure and provided on a rotation axis passing through a center of gravity of said unit;

second gearwheels coupled to said chassis; and a chain hung to said first and second pulleys, and said first pulley is communicated with said second gearwheels by said chain.

8. The accommodation apparatus according to claim 7, wherein said chassis further comprises:

a second frame structure configured to accommodate said first frame structure; and slide rails configured to allow said second frame structure to slide on said slide rails such that said unit is pulled out, and said second gearwheels are provided for said second frame structure.

9. The accommodation apparatus according to claim 1, wherein said supporting mechanism comprises:

first and second circular arcs coupled to said first frame structure, wherein a center position of said first and second circular arcs passes through a center of gravity of said unit; and bearings coupled to said chassis, and said first frame structure is rotated when said first and second circular arcs are moved through said bearings.

10. The accommodation apparatus according to claim 9, wherein said chassis further comprises:

a second frame structure configured to accommodate said first frame structure; and slide rails configured to allow said second frame structure to slide on said slide rails such that said unit is pulled out, and said bearings are provided for said second frame structure.

11. The accommodation apparatus according to claim 9, wherein each of said bearings comprises:

a bearing body provided for said chassis to have a surface corresponding to a corresponding one of said first and second circular arcs; and balls provided between the corresponding one of said first and second circular arcs and said bearing body, and each of said first and second circular arcs and said bearings has a groove with a semicircular cross section.

12. The accommodation apparatus according to claim 9, wherein each of said bearings comprises:

a bearing body provided for said chassis to have a surface corresponding to a corresponding one of said first and second circular arcs; and balls provided between the corresponding one of said first and second circular arcs and said bearing body, and each of said first and second circular arcs and said bearings has a groove with a cuneal cross section.

13. The accommodation apparatus according to claim 9, wherein each of said bearings comprises:

a bearing body provided for said chassis to have a surface corresponding to a corresponding one of said first and second circular arcs; and rollers provided between the corresponding one of said first and second circular arcs and said bearing body.

14. The accommodation apparatus according to claim 9, wherein each of said bearings comprises:

a bearing body provided for said chassis to have a surface corresponding to a corresponding one of said first and second circular arcs; and a spacer provided between the corresponding one of said first and second circular arcs and said bearing body.

15. The accommodation apparatus according to claim 1, wherein said chassis further comprises:

a second frame structure configured to accommodate said first frame structure; and slide rails configured to allow said second frame structure to slide on said slide rails such that said unit is pulled out.

16. The accommodation apparatus according to claim 15, wherein a rotation direction of said first frame structure is orthogonal to a direction of said slide rails.

* * * * *

UNITED STATES PATENT AND TRADEMARK OFFICE
CERTIFICATE OF CORRECTION

PATENT NO. : 7,360,660 B2  Page 1 of 1
APPLICATION NO. : 11/080559
DATED : April 22, 2008
INVENTOR(S) : Hiroyuki Tsuzuki It is certified that error appears in the above-identified patent and that said Letters Patent is hereby corrected as shown below:

Column 12;
Claim 1, Line 12, delete "maintance" and insert -- maintenance --

Column 14;
Claim 15, Line 7, delete "out" and insert -- out, and said bearings are provided for said second frame structure. --

Signed and Sealed this

Seventeenth Day of February, 2009

JOHN DOLL
*Acting Director of the United States Patent and Trademark Office*